US009107300B2

(12) United States Patent
Kushta

(10) Patent No.: US 9,107,300 B2
(45) Date of Patent: Aug. 11, 2015

(54) RESONANT VIA STRUCTURES IN MULTILAYER SUBSTRATES AND FILTERS BASED ON THESE VIA STRUCTURES

(75) Inventor: Taras Kushta, Tokyo (JP)

(73) Assignee: NEC CORPORATION, Tokyo (JP)

( * ) Notice: Subject to any disclaimer, the term of this patent is extended or adjusted under 35 U.S.C. 154(b) by 339 days.

(21) Appl. No.: 13/515,840

(22) PCT Filed: Dec. 14, 2009

(86) PCT No.: PCT/JP2009/071084
§ 371 (c)(1),
(2), (4) Date: Aug. 22, 2012

(87) PCT Pub. No.: WO2011/074105
PCT Pub. Date: Jun. 23, 2011

(65) Prior Publication Data
US 2012/0306597 A1    Dec. 6, 2012

(51) Int. Cl.
*H01P 1/203* (2006.01)
*H01P 7/08* (2006.01)
*H05K 1/02* (2006.01)
(Continued)

(52) U.S. Cl.
CPC .............. *H05K 1/0222* (2013.01); *H01P 1/203* (2013.01); *H01P 7/08* (2013.01); *H05K 1/0251* (2013.01); *H05K 1/116* (2013.01); *H05K 1/162* (2013.01); *H05K 3/429* (2013.01); *H05K 2201/09618* (2013.01)

(58) Field of Classification Search
CPC ........... H01P 1/203; H01P 1/205; H01P 3/08; H01P 7/08
USPC .......... 333/202–204, 206, 219, 222, 246, 238
See application file for complete search history.

(56) References Cited

U.S. PATENT DOCUMENTS

| 5,357,218 | A | * | 10/1994 | Wingfield et al. | 331/96 |
| 5,640,048 | A | | 6/1997 | Selna | |
| 5,741,729 | A | | 4/1998 | Selna | |
| 6,191,666 | B1 | * | 2/2001 | Sheen | 333/185 |

(Continued)

FOREIGN PATENT DOCUMENTS

| JP | 59-013401 A | 1/1984 |
| JP | 8-172141 A | 7/1996 |

(Continued)

OTHER PUBLICATIONS

DuPont, "Interra HK 04 Series of Embedded Planar Capacitor Lamiantes", Nov. 5, 2003, DuPont Electronic Technologies, p. 3.*

(Continued)

*Primary Examiner* — Robert Pascal
*Assistant Examiner* — Gerald Stevens
(74) *Attorney, Agent, or Firm* — McGinn IP Law A Firm, Pllc.

(57) ABSTRACT

A resonant via structure is provided with a multilayer substrate, a signal via conductor and ground vias. The multilayer substrate includes conductor layers and a dielectric. The dielectric isolates each of the conductor layers. The signal via conductor is disposed through the multilayer substrate. The ground vias are disposed through the multilayer substrate and around the signal via conductor. The dielectric comprises two sections disposed between the signal via and ground vias, in the plane of conductor layers. The first section is disposed between the first layer and other layer of the conductor layers. The second section is disposed between the other layer and the last layer of the conductor layers.

20 Claims, 49 Drawing Sheets

(51) Int. Cl.
*H05K 1/11* (2006.01)
*H05K 1/16* (2006.01)
*H05K 3/42* (2006.01)

(56) References Cited

U.S. PATENT DOCUMENTS

| | | | |
|---|---|---|---|
| 6,265,954 B1 * | 7/2001 | Krause | 333/204 |
| 2004/0041277 A1 | 3/2004 | Kimura et al. | |
| 2006/0145330 A1 | 7/2006 | Yoshiyuki et al. | |
| 2006/0186970 A1 * | 8/2006 | Shi et al. | 333/176 |
| 2007/0103251 A1 * | 5/2007 | Fan et al. | 333/33 |
| 2008/0093112 A1 | 4/2008 | Kushta | |

FOREIGN PATENT DOCUMENTS

| | | | |
|---|---|---|---|
| JP | 2001-267817 A | | 9/2001 |
| JP | 2001-291799 A | | 10/2001 |
| JP | 2004-095614 A | | 3/2004 |
| JP | 2007-158675 A | | 6/2007 |
| JP | 2008-507858 A | | 3/2008 |
| WO | WO 2006/009274 | * 1/2006 | ............ H01P 1/203 |

OTHER PUBLICATIONS

International Search Report in PCT/JP2009/071084 dated Mar. 30, 2010(English Translation Thereof).

* cited by examiner

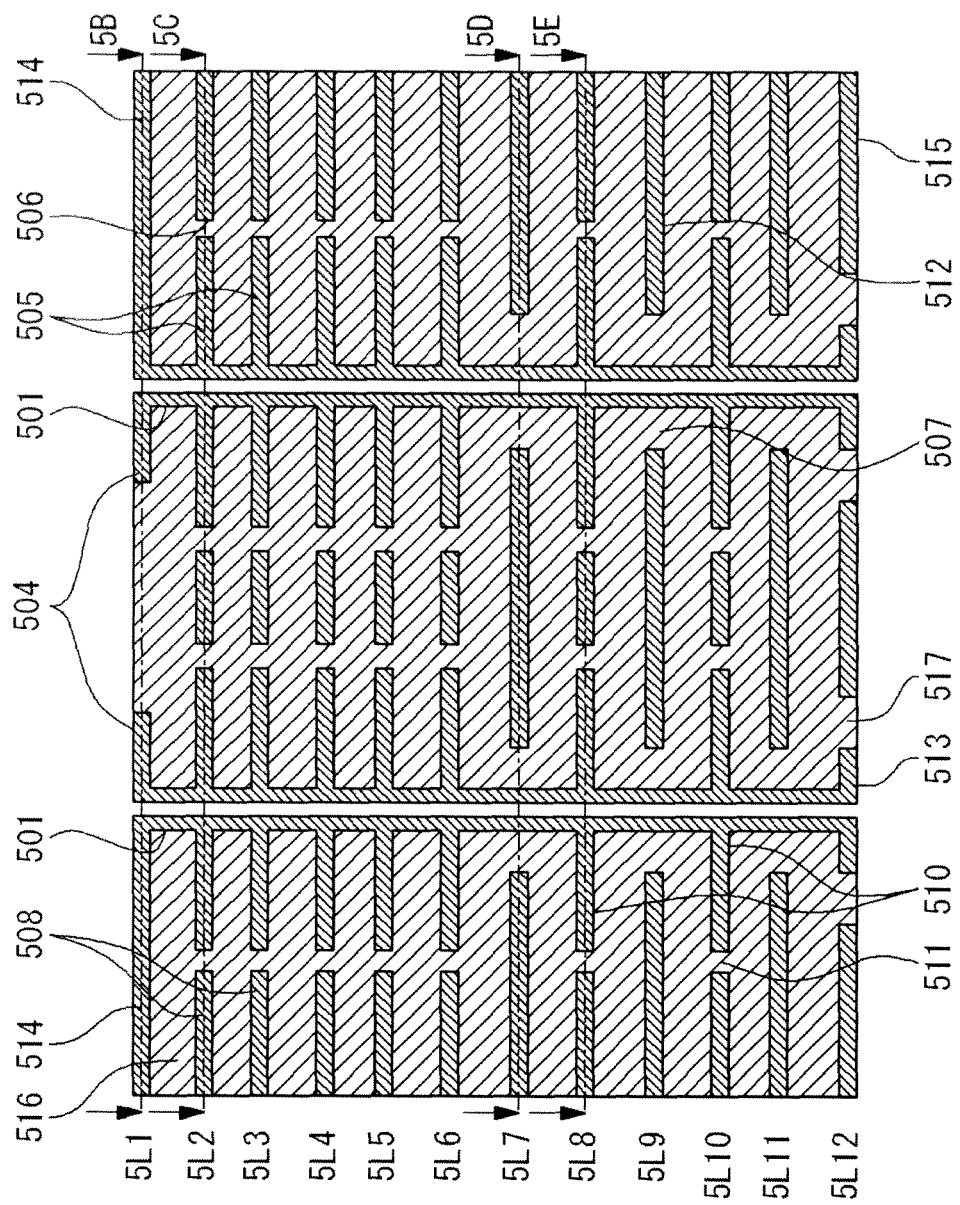

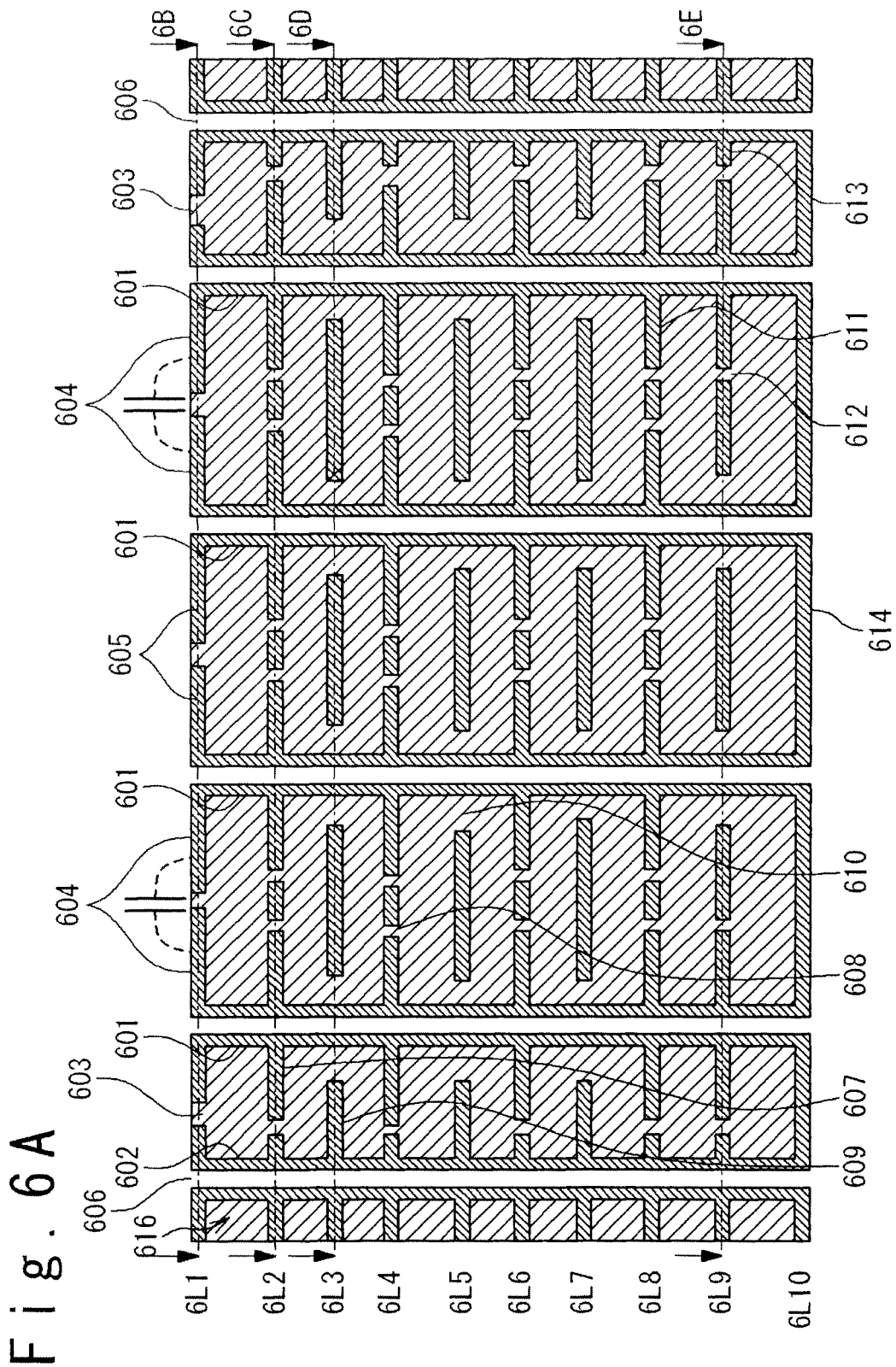

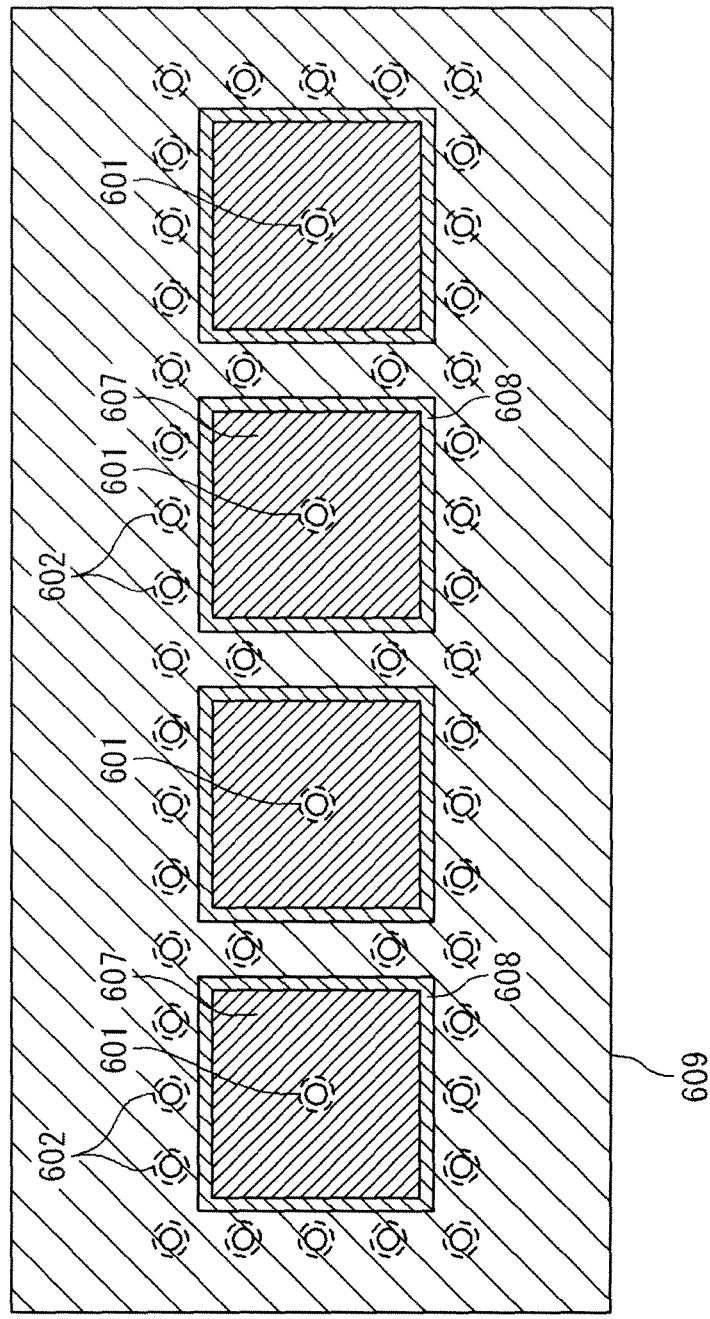

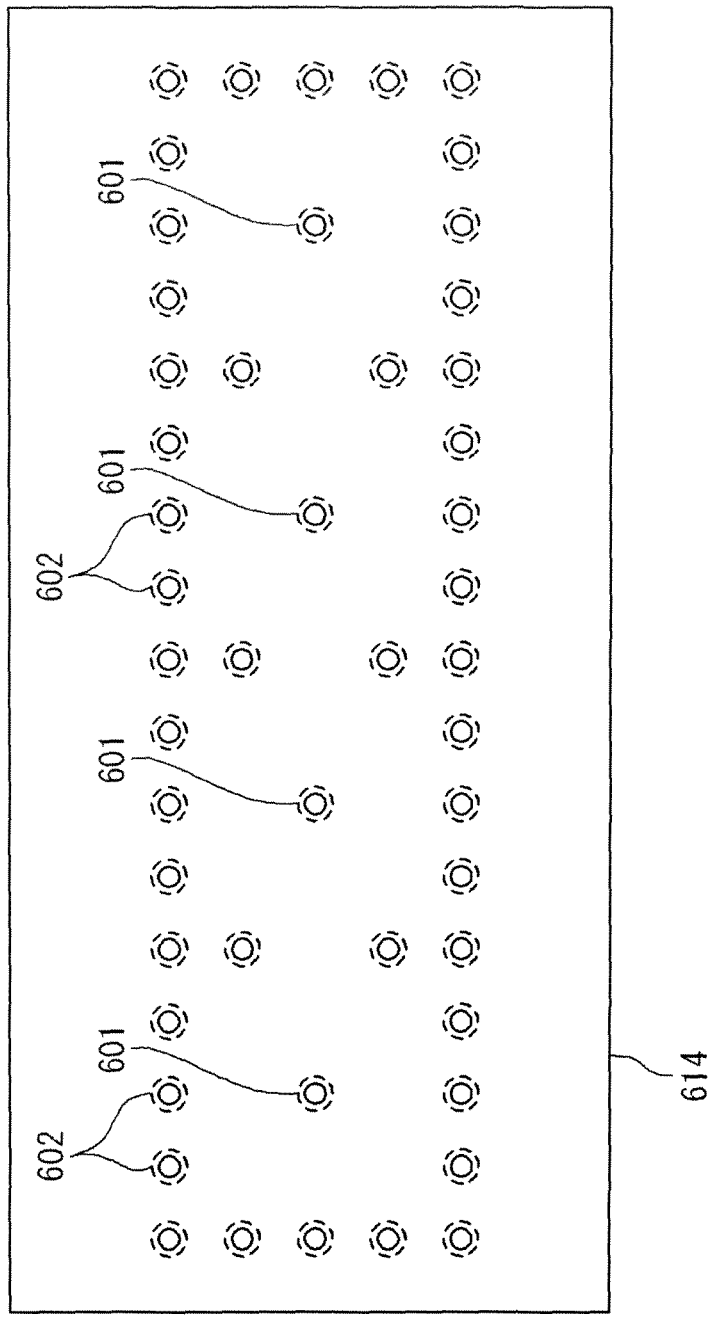

RESONANT VIA STRUCTURES IN MULTILAYER SUBSTRATES AND FILTERS BASED ON THESE VIA STRUCTURES

TECHNICAL FIELD

The present invention relates to resonant elements, resonators, and filters based on multilayer substrate technologies.

BACKGROUND ART

Modern and next-generation networking and computing equipment need compact and cost-effective devices. Also, energy consumption in the equipment has to be minimal. Multilayer substrates serve as main interconnect technologies in electronic devices constructed by means of a chip, a package and a printed circuit board. Besides that, interconnection circuits in multilayer substrates are a base in forming distributed passive components applied widely in electronics systems at microwave and millimeter waves.

As for an example, open-circuited and short-circuited planar transmission line segments of different forms and dimensions act as stubs, resonators, and other elements of the components.

Via structures formed by signal and ground vias conjointly serve mainly as vertical interconnections between planar transmission-lines disposed at different conductor layers of the multilayer board.

Japanese Laid Open Application JP 2008-507858 (US 2008/0093112A1) discloses composite via structures which can be used, besides as the vertical interconnections, to design both open-circuited and short-circuited stubs and, as result, compact filtering components based on multilayer boards.

However, further dimensional reductions of passive components including filtering structures are necessary in a cost-effective manner for their application in next-generation computing and networking systems.

Also, it is important to obtain methods which can be used to provide compactness of resonant elements in the vertical direction.

CITATION LIST

Patent Literature: Japanese Laid Open Application JP 2008-507858 (US 2008/0093112A1).

SUMMARY OF INVENTION

It is an object of the present invention to provide compact resonant elements in multilayer substrates.

In an aspect of the present invention, such resonant elements are provided by forming specific via structures having inner and outer vertical conductive boundaries. The inner conductive boundary includes a signal via while ground vias surrounding the signal via shape the outer conductive boundary.

The area between the signal via and ground vias is filled by two artificial mediums having different relative dielectric permittivities.

One of artificial mediums is formed by means of signal conductive plates connected to the signal via and ground conductive plates connected to ground vias. Each of the signal conductive plates is arranged under or above each of the ground conductive plates. Signal conductive plates are separated from ground conductors by isolating slits and the ground conductive plates are isolated from signal via conductor by a clearance hole.

Another of artificial medium is obtained by means of signal conductive plates connected to the signal via conductor and separated from ground conductors by isolating slits.

It is another object of this invention to provide filtering components using invented resonant via structures having compact dimensions.

BRIEF DESCRIPTION OF DRAWINGS

FIG. 5A is a vertical cross-sectional view illustrating a filter formed by two resonant via structures in an exemplary embodiment of the present invention;

FIG. 6A is a vertical cross-sectional view illustrating a filter formed by two resonant via structures in an exemplary embodiment of the present invention;

FIG. 6C is a horizontal cross-sectional view of the filter shown in FIG. 6A on the 6C section;

FIG. 6F is a bottom view of the filter shown in FIG. 6A;

DESCRIPTION OF EMBODIMENTS

Figure 1A:
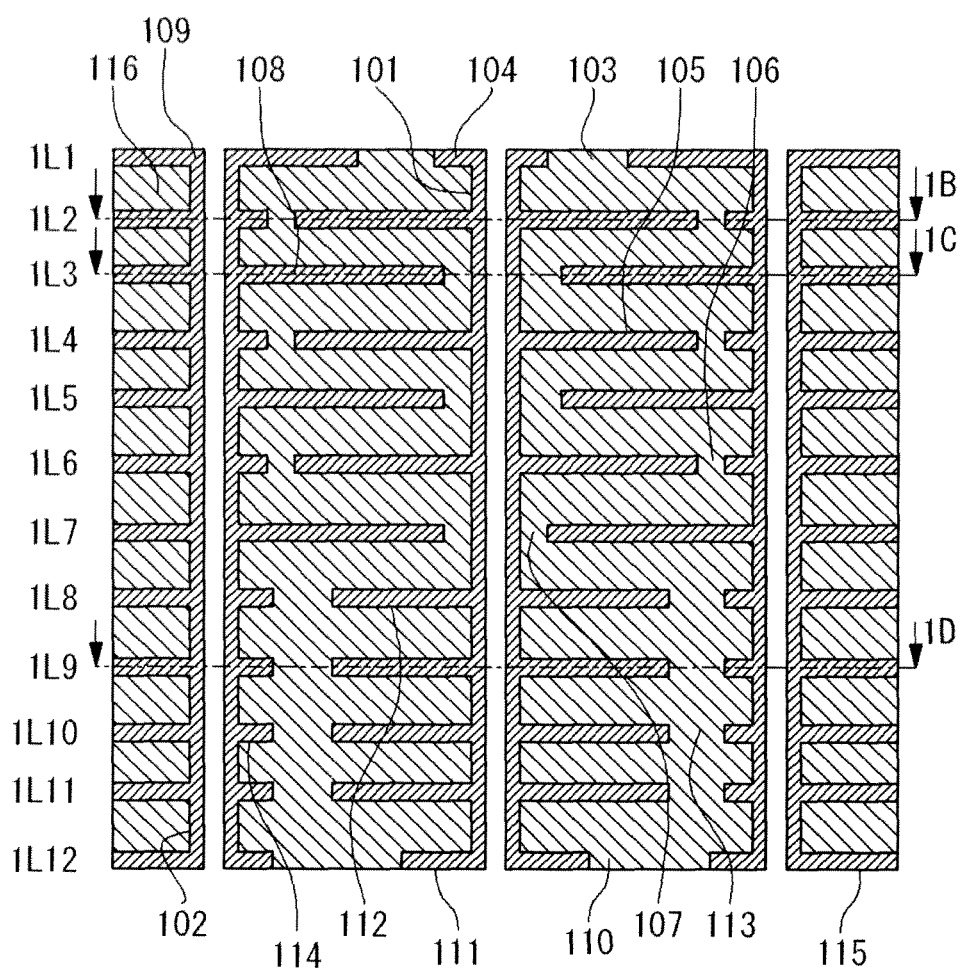
FIG. 1A is a vertical cross-sectional view illustrating a resonant via structure in an exemplary embodiment of the present invention.
Figure 1B:
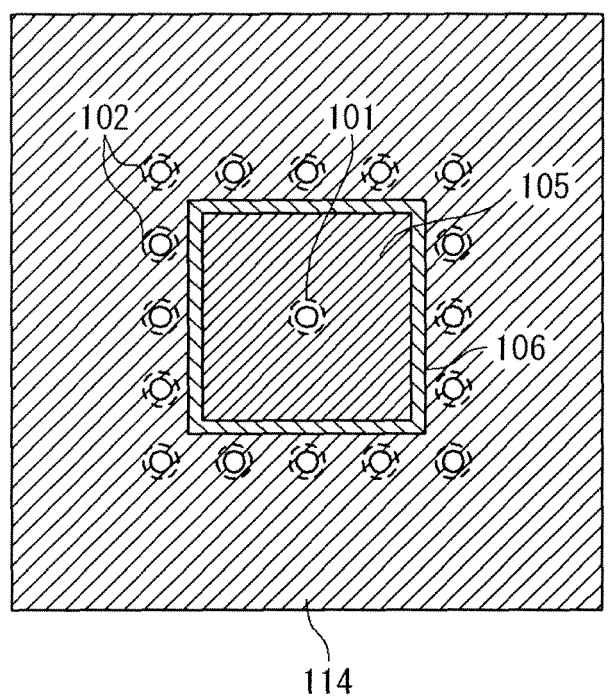
FIG. 1B is a horizontal cross-sectional view of the resonant via structure shown in FIG. 1A on the 1B section.
Figure 1C:
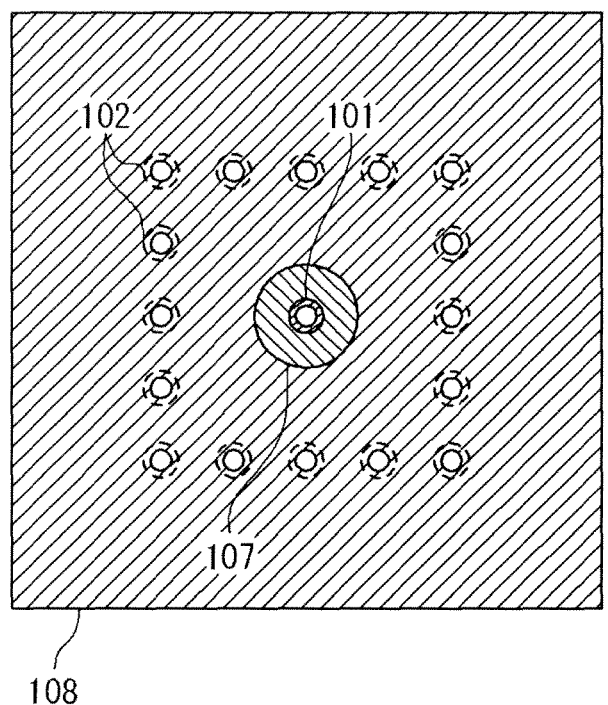
FIG. 1C is a horizontal cross-sectional view of the resonant via structure shown in FIG. 1A on the 1C section.
Figure 1D:
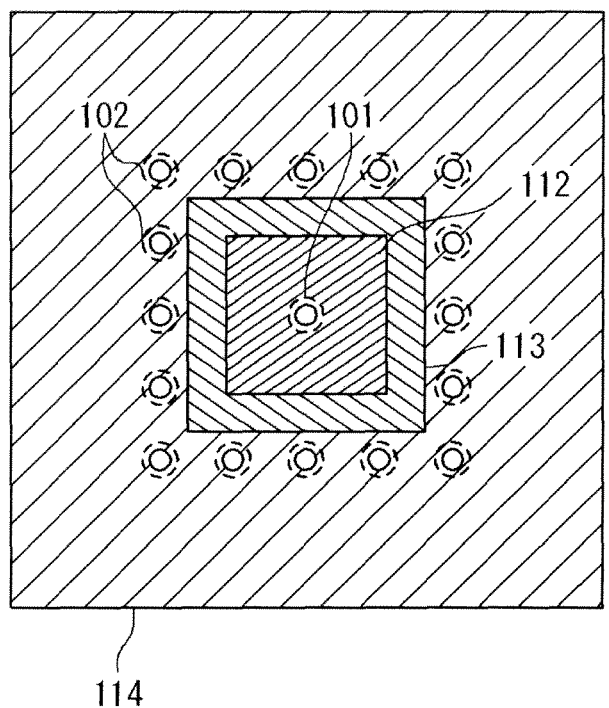
FIG. 1D is a horizontal cross-sectional view of the resonant via structure shown in FIG. 1A on the 1D section.
Figure 1E:
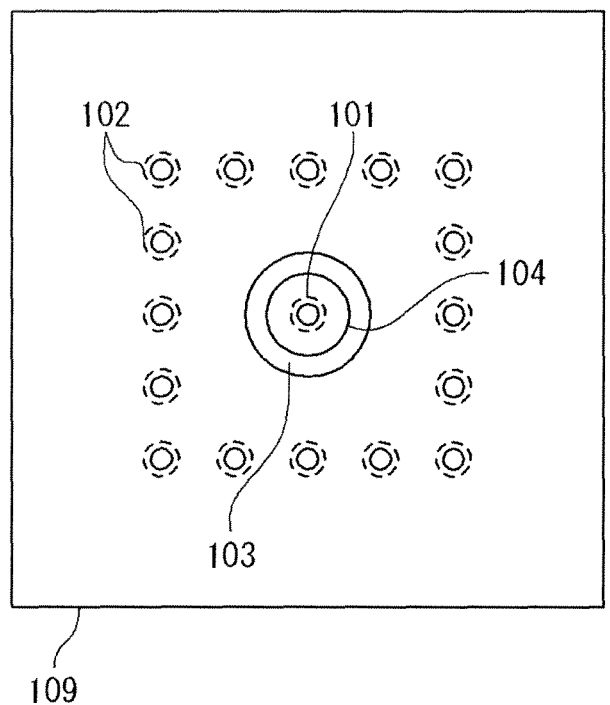
FIG. 1E is top view of the resonant via structure shown in FIG. 1A.
Figure 1F:
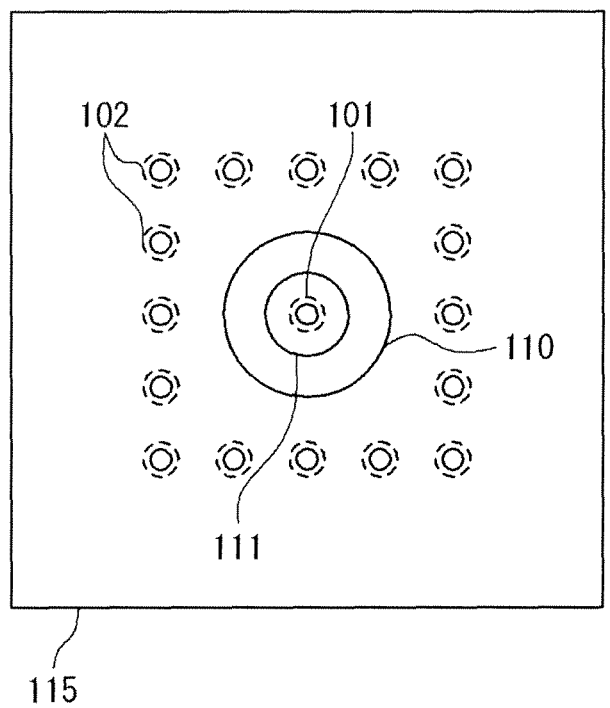
FIG. 1F is bottom view of the resonant via structure shown in FIG. 1A.
Figure 1G:
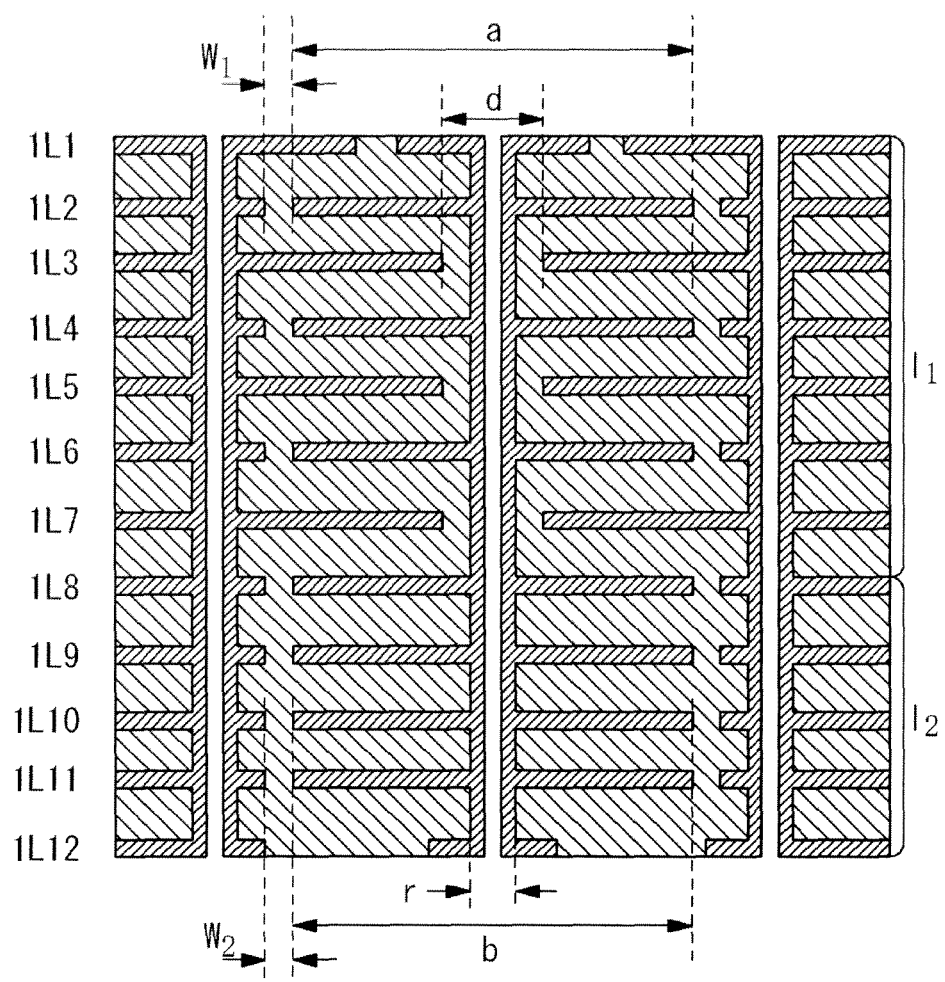
FIG. 1G is a drawing showing the vertical cross-sectional view with dimension notation.

Hereinafter, several types of resonant via structures and filters based on these resonant via structures disposed in multilayer substrates according to the present invention will be described in details with reference to attached drawings. But, it would be well understood that this description should not be viewed as narrowing the appended claims.

In FIGS. 1A to 1H, an exemplary embodiment of a resonant via structure in a twelve-conductor-layer substrate is shown.

It should be noted that this twelve-conductor-layer substrate is only an example of multilayer substrates and a number of conductor layers, filling material and other substrate parameters can be different that depends on applications.

In present embodiment, the resonant via structure comprises a plurality of conductor layers 1L1, 1L2, 1L3, 1L4, 1L5, 1L6, 1L7, 1L8, 1L9, 1L10, 1L11, and 1L12, a dielectric 116, a signal via 101, a plurality of ground vias 102, a top ground plate 109, a bottom ground plate 115, a couple of pads 104 and 111, a couple of clearance holes 103 and 110, a plurality of signal conductive plates 105 and 112, a plurality of isolating slits 106 and 113, a plurality of clearance holes 107, a plurality of ground plates 108, and a plurality of ground conductors 114.

Conductor layers 1L1, 1L2, 1L3, 1L4, 1L5, 1L6, 1L7, 1L8, 1L9, 1L10, 1L11, and 1L12 in shown substrate are isolated by a dielectric 116. The signal via 101 is surrounded by ground vias 102. The pad 104 is isolated from the top ground plate 109 by a clearance hole 103. The pad 111 is isolated from the bottom ground plate 115 by the clearance hole 110. Note that ground vias are arranged according to a square contour.

Two artificial mediums are formed between signal and ground vias to increase the relative permittivity between signal and ground vias and also to obtain a step of the characteristic impedance in the vertical direction. This way gives a possibility to design a via structure having resonance in the vertical direction, that is perpendicularly to the conductor layers. In demonstrated resonant via structure, the first artificial medium is situated in the vertical direction between conductor layers 1L1 and 1L8 and is constructed by means of signal conductive plates 105 connected to the signal via 101 and ground plates 108 connected to the ground vias 102. Signal conductive plates 105 are isolated from ground conductors 114 by isolating slits 106, while ground plates 108 are separated from the signal via by clearance holes 107. Construction as signal-ground-signal-ground- . . . -in plate arrangement is used in presented example. This technique gives a possibility to obtained artificial medium with the relative effective permittivity higher than the relative permittivity of the substrate dielectric material 116. This effective permittivity is dependent on dimensions of signal conductive plates 105 and clearance holes 107 as well as the width of isolating slits 106.

The second artificial medium is formed between conductor layers 1L8 and 1L12 (including conductor layer 1L8) and is designed by means of signal conductive plates 112 connected to the signal via and isolated from ground conductors 114 by isolating slits 113. In this artificial medium, the relative effective permittivity is function of dimensions of the signal conductive plates 112 and the width of the isolating slits 113. It is important to note that the relative effective permittivity of the second artificial medium is higher than the relative permittivity of the dielectric 116, but lower than the effective permittivity of the first artificial medium.

Thus, two artificial mediums having the effective relative permittivities higher than the relative permittivity of the isolating dielectric between conductor layers give a shorter resonant length in the vertical direction of the via structures. Moreover, a step in the characteristic impedance due to a difference in the relative effective permittivity of two artificial mediums shortens also the resonant conditions in the vertical direction for the via structures.

Figure 1H:
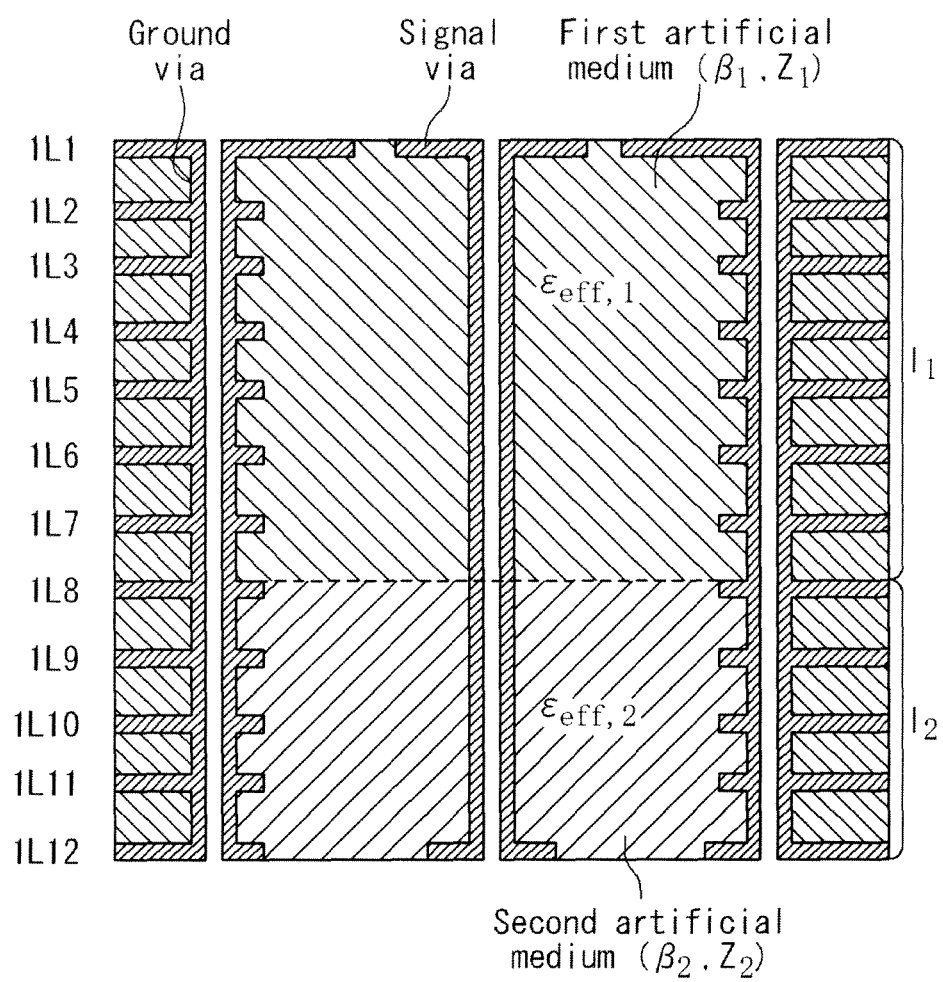
FIG. 1H is a drawing showing a simplified physical model of invented resonant via structures.
Figure 2A:
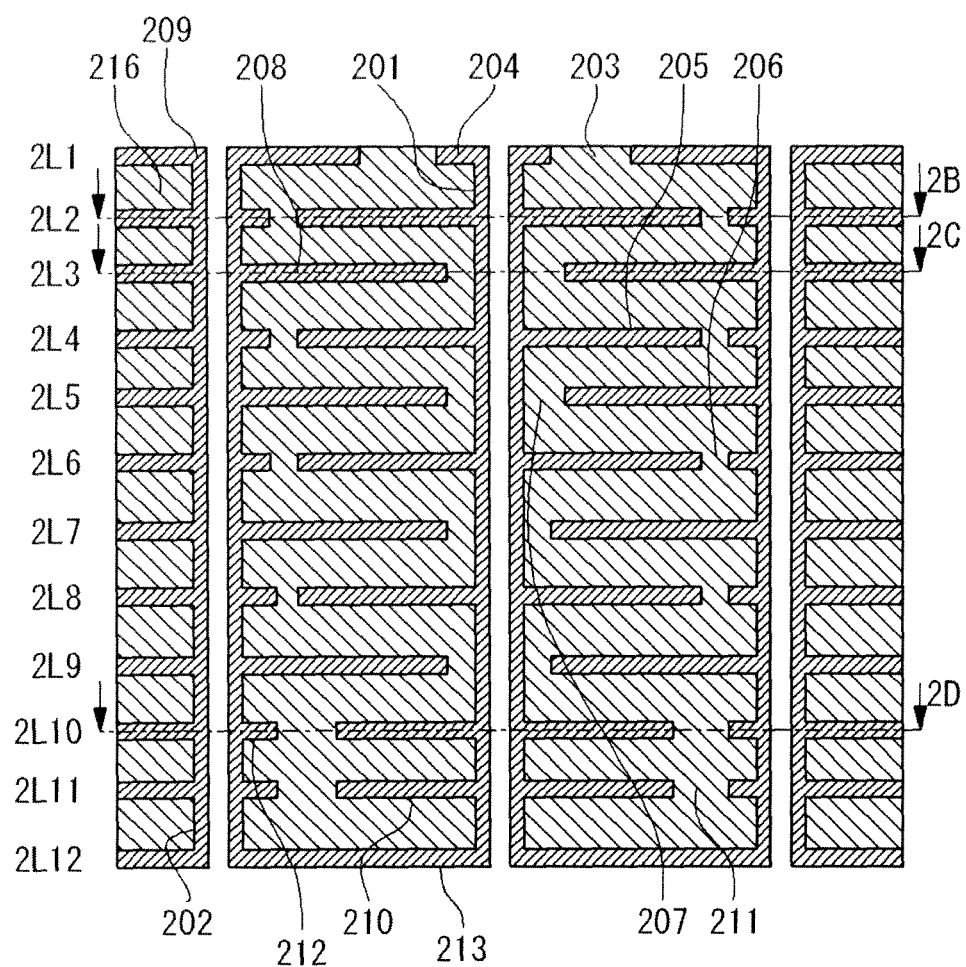
FIG. 2A is a vertical cross-sectional view illustrating a resonant via structure in an exemplary embodiment of the present invention.
Figure 2B:
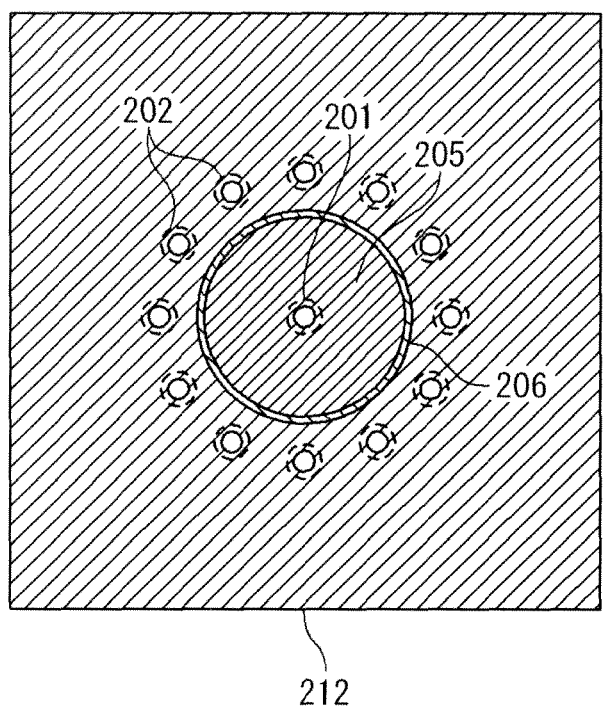
FIG. 2B is a horizontal cross-sectional view of the resonant via structure shown in FIG. 2A on the 2B section.
Figure 2C:
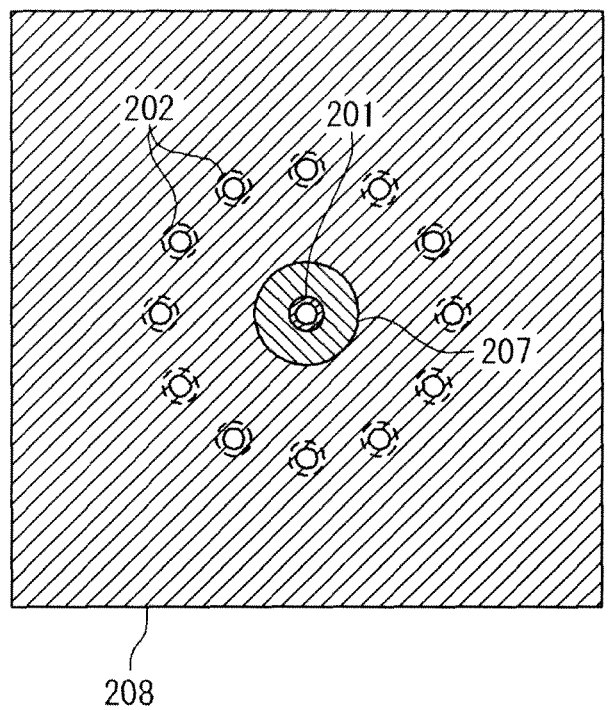
FIG. 2C is a horizontal cross-sectional view of the resonant via structure shown in FIG. 2A on the 2C section.
Figure 2D:
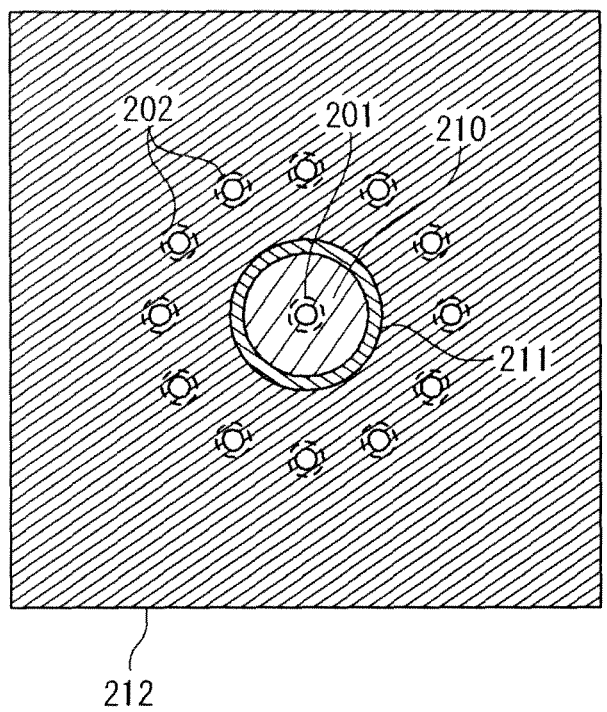
FIG. 2D is a horizontal cross-sectional view of the resonant via structure shown in FIG. 2A on the 2D section.
Figure 2E:
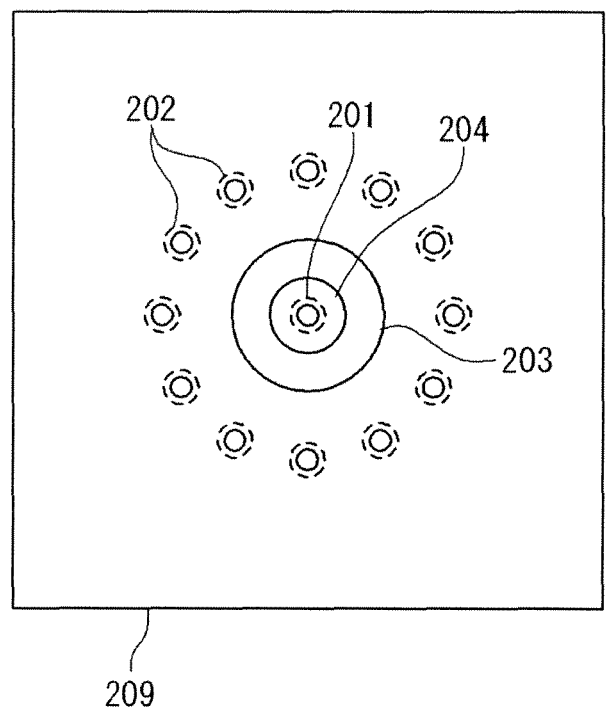
FIG. 2E is top view of the resonant via structure shown in FIG. 2A.
Figure 2F:
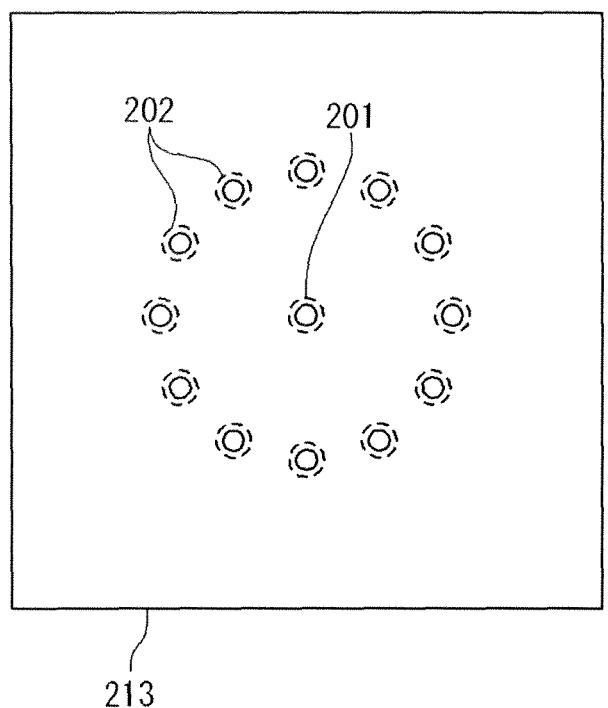
FIG. 2F is bottom view of the resonant via structure shown in FIG. 2A.
Figure 3A:
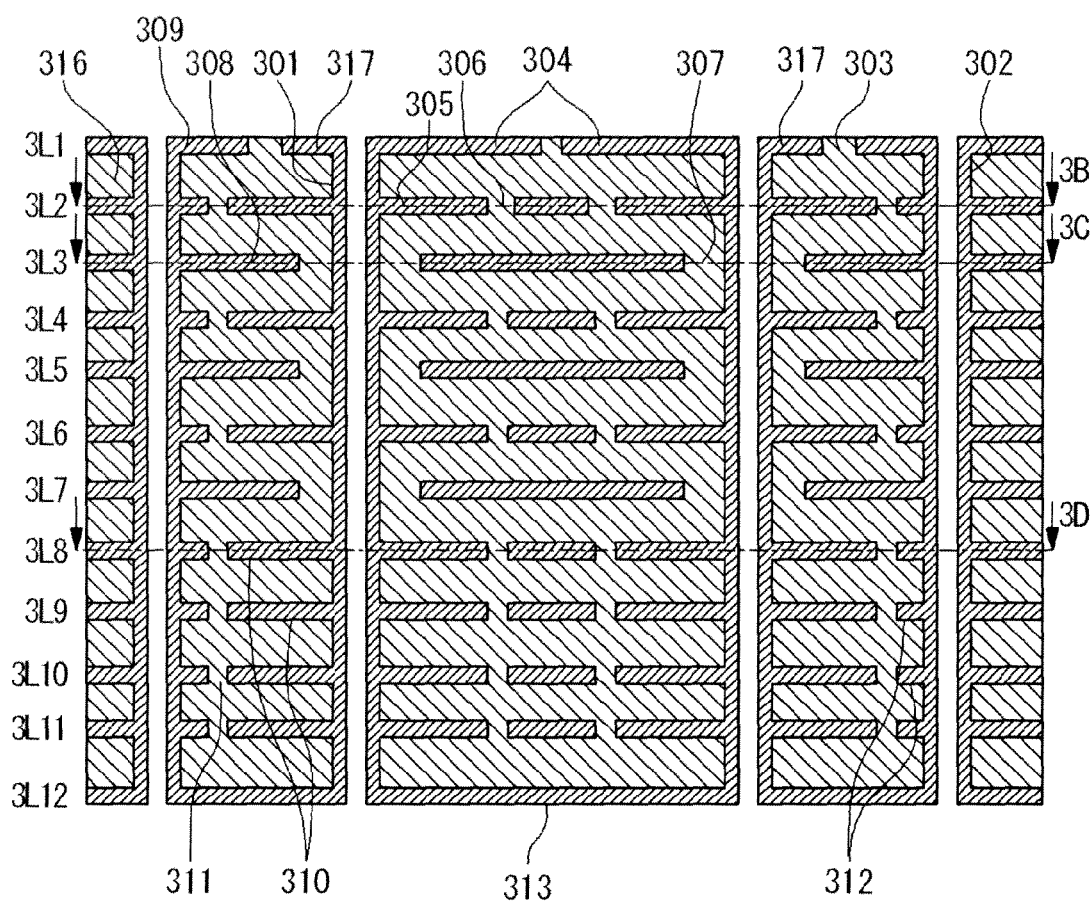
FIG. 3A is a vertical cross-sectional view illustrating a filter formed by two resonant via structures in an exemplary embodiment of the present invention.
Figure 3B:
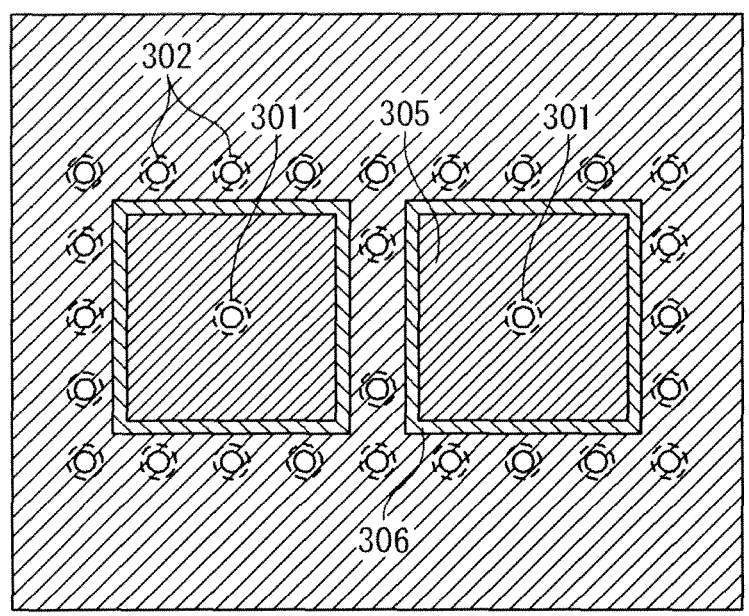
FIG. 3B is a horizontal cross-sectional view of the filter shown in FIG. 3A on the 3B section.
Figure 3C:
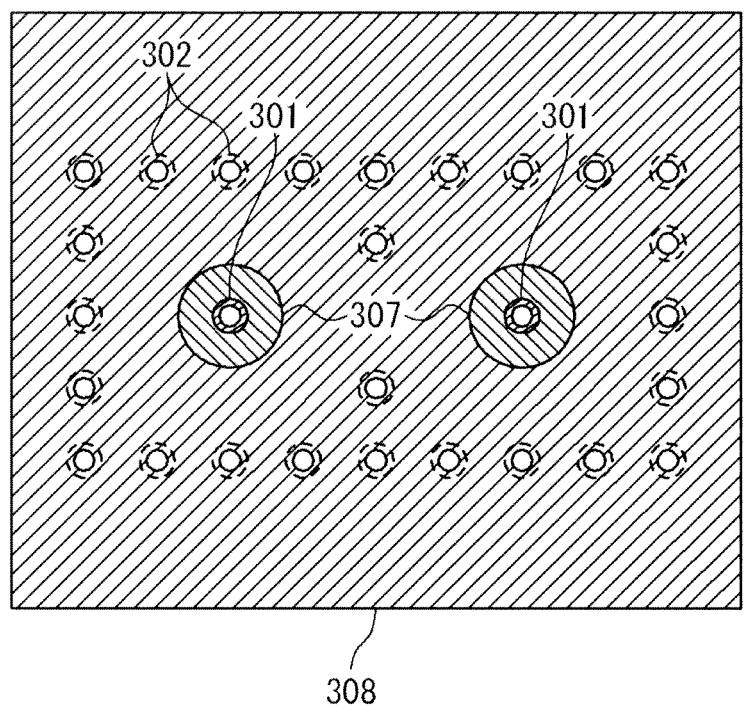
FIG. 3C is a horizontal cross-sectional view of the filter shown in FIG. 3A on the 3C section.
Figure 3D:
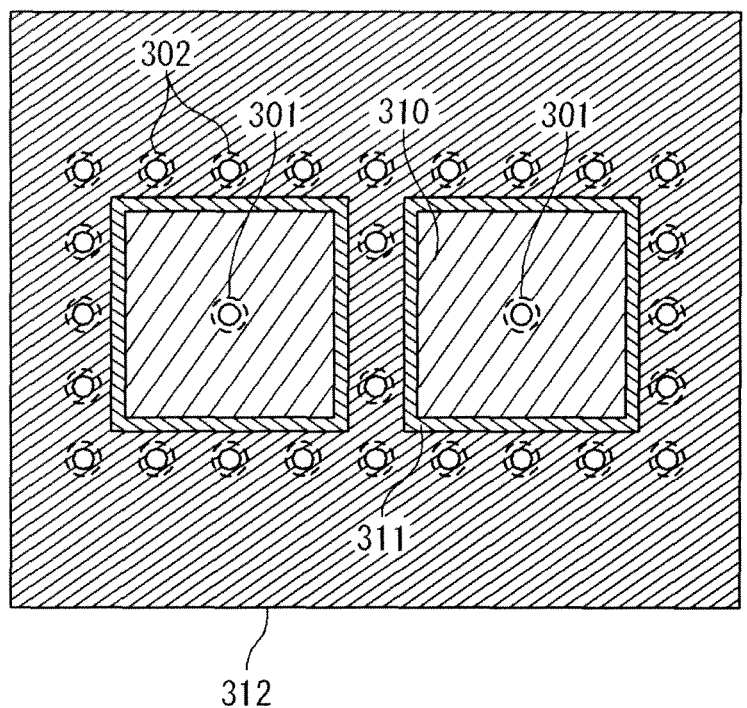
FIG. 3D is a horizontal cross-sectional view of the filter shown in FIG. 3A on the 3D section.
Figure 3E:
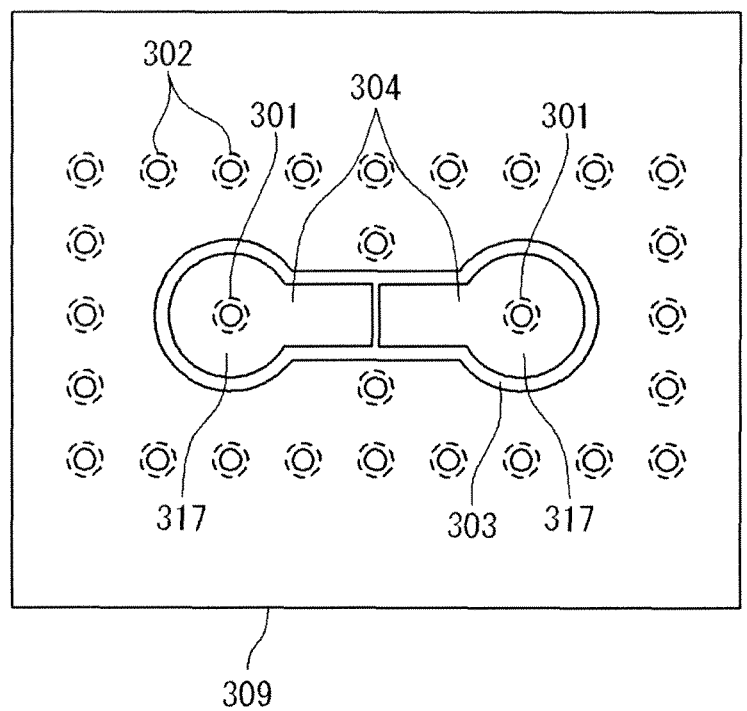
FIG. 3E is top view of the filter shown in FIG. 3A.
Figure 3F:
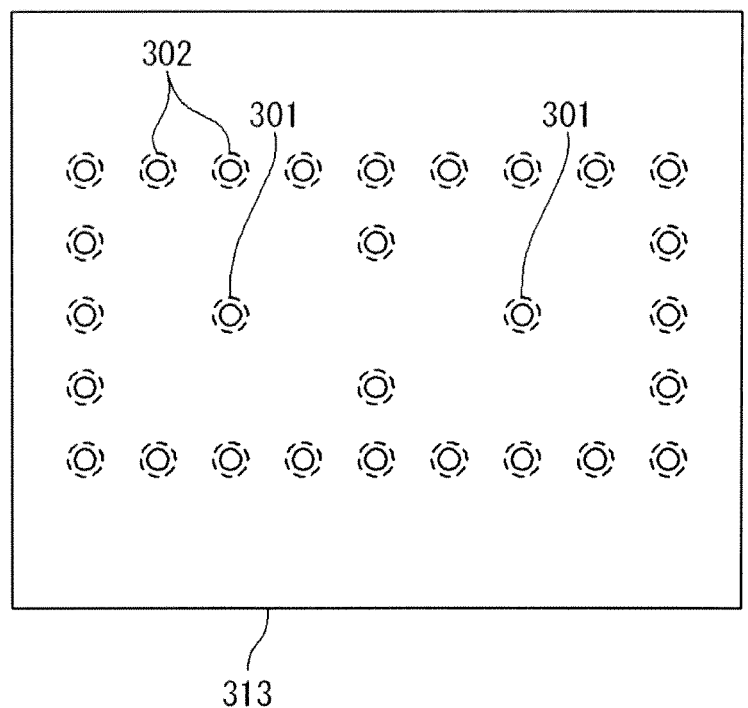
FIG. 3F is bottom view of the filter shown in FIG. 3A.
Figure 4A:
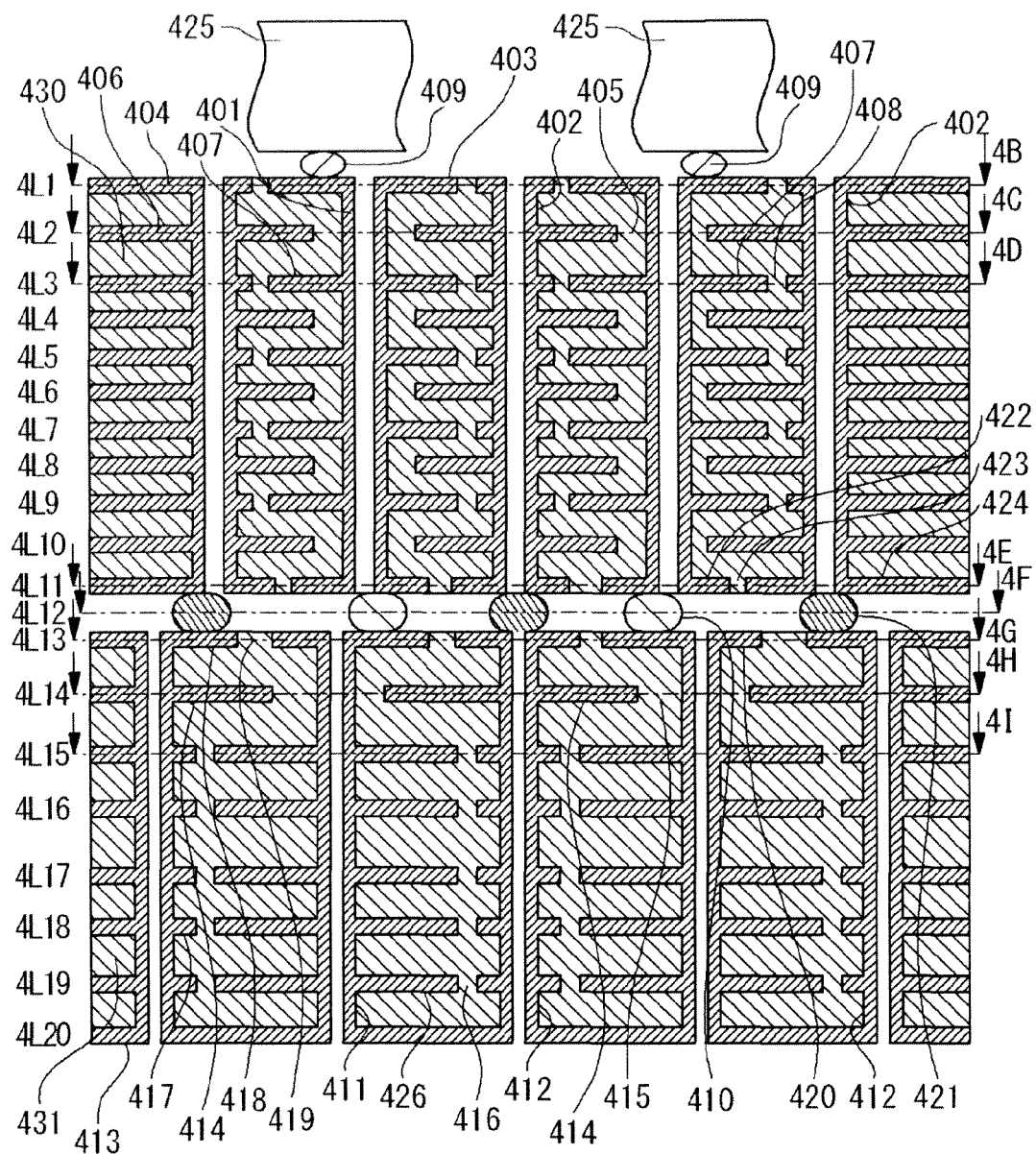
FIG. 4A is a vertical cross-sectional view illustrating a filter formed by two resonant via structures in an exemplary embodiment of the present invention.
Figure 4B:
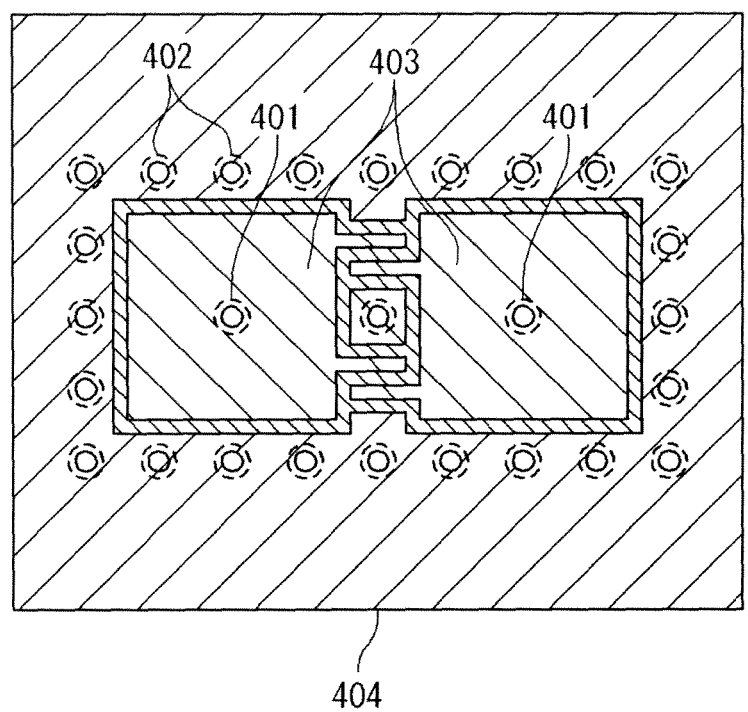
FIG. 4B is a horizontal cross-sectional view of the filter shown in FIG. 4A on the 4B section.
Figure 4C:
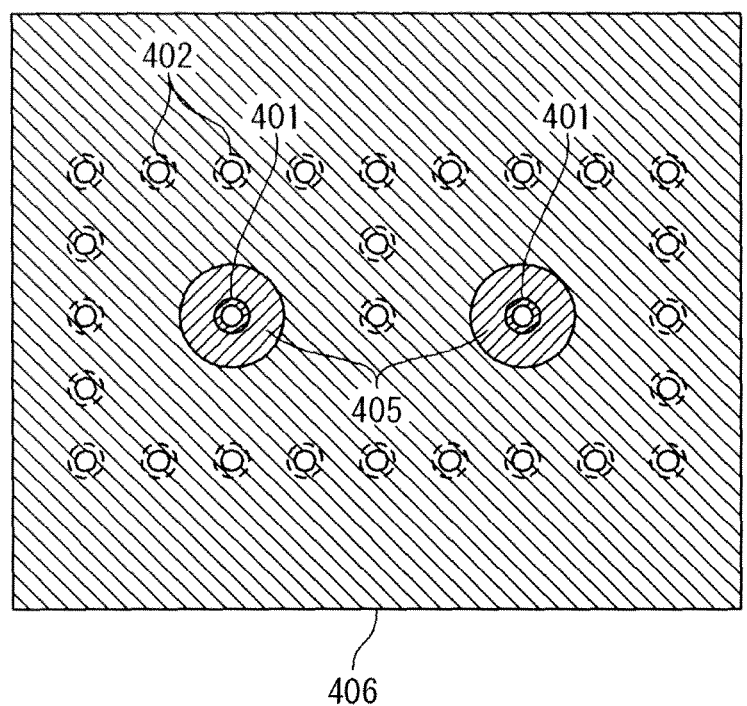
FIG. 4C is a horizontal cross-sectional view of the filter shown in FIG. 4A on the 4C section.
Figure 4D:
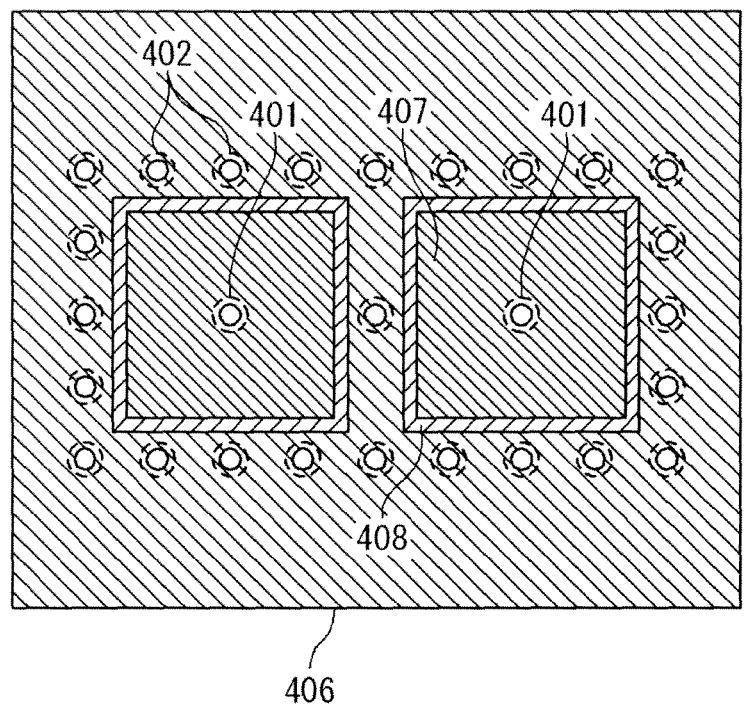
FIG. 4D is a horizontal cross-sectional view of the filter shown in FIG. 4A on the 4D section.
Figure 4E:
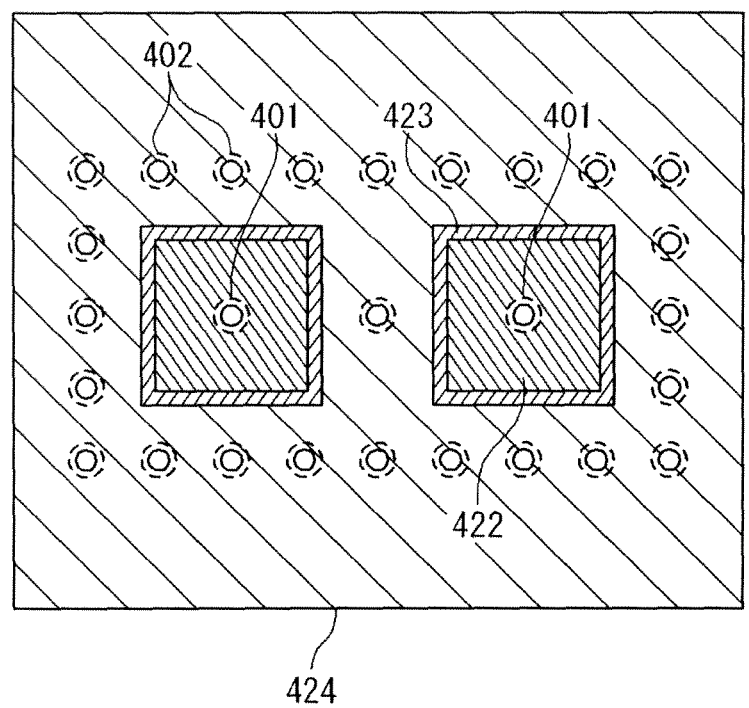
FIG. 4E is a horizontal cross-sectional view of the filter shown in FIG. 4A on the 4E section.
Figure 4F:
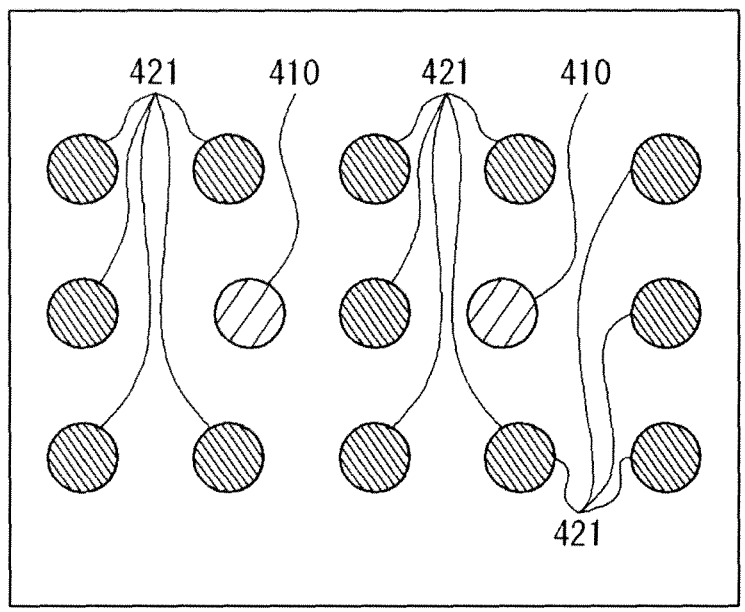
FIG. 4F is a horizontal cross-sectional view of the filter shown in FIG. 4A on the 4F section.
Figure 4G:
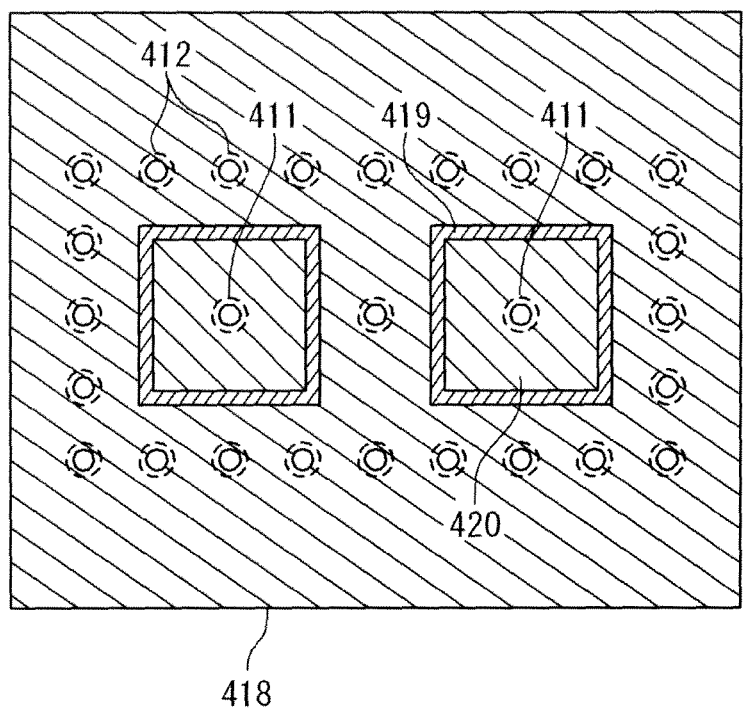
FIG. 4G is a horizontal cross-sectional view of the filter shown in FIG. 4A on the 4G section.
Figure 4H:
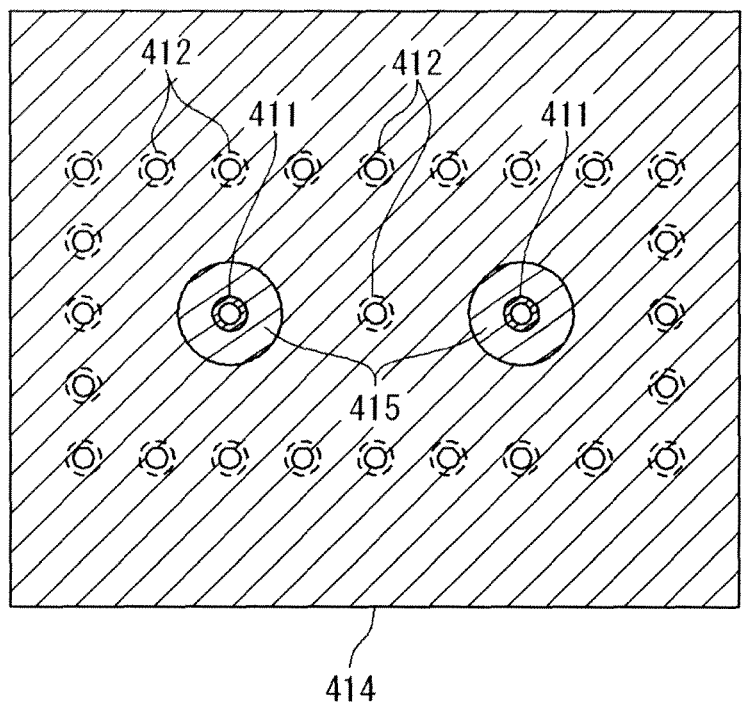
FIG. 4H is a horizontal cross-sectional view of the filter shown in FIG. 4A on the 4H section.
Figure 4I:
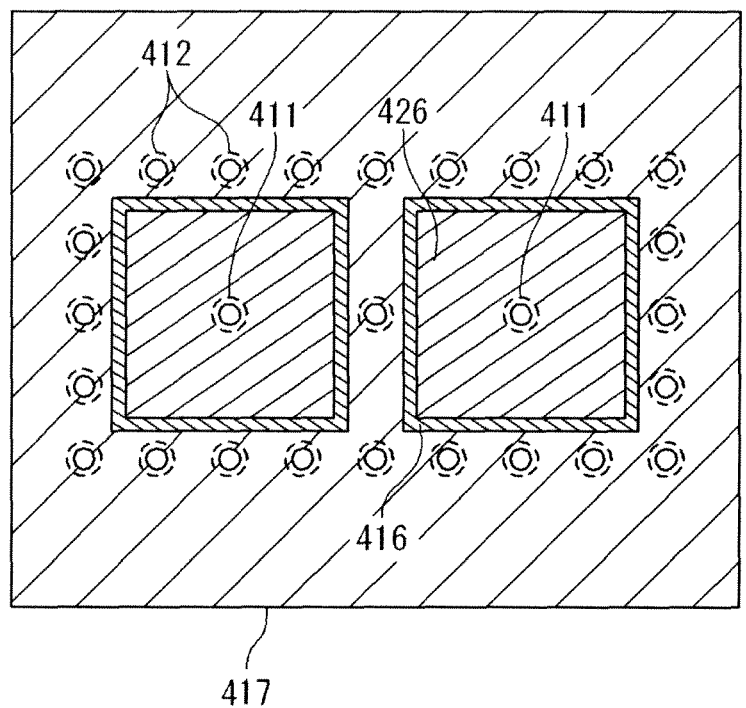
FIG. 4I is a horizontal cross-sectional view of the filter shown in FIG. 4A on the 4I section.
Figure 4J:
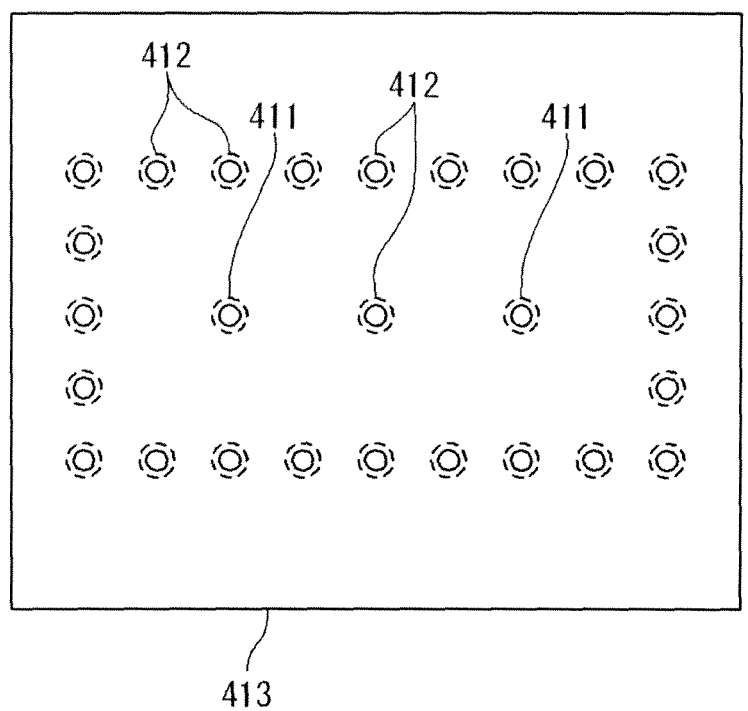
FIG. 4J is bottom view of the filter shown in FIG. 4A.
Figure 5B:
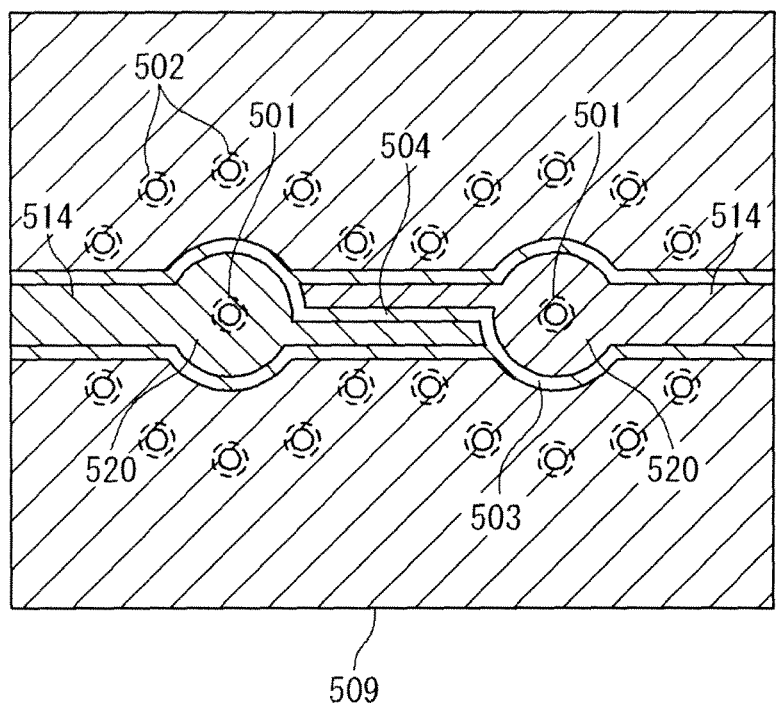
FIG. 5B is a horizontal cross-sectional view of the filter shown in FIG. 5A on the 5B section.
Figure 5C:
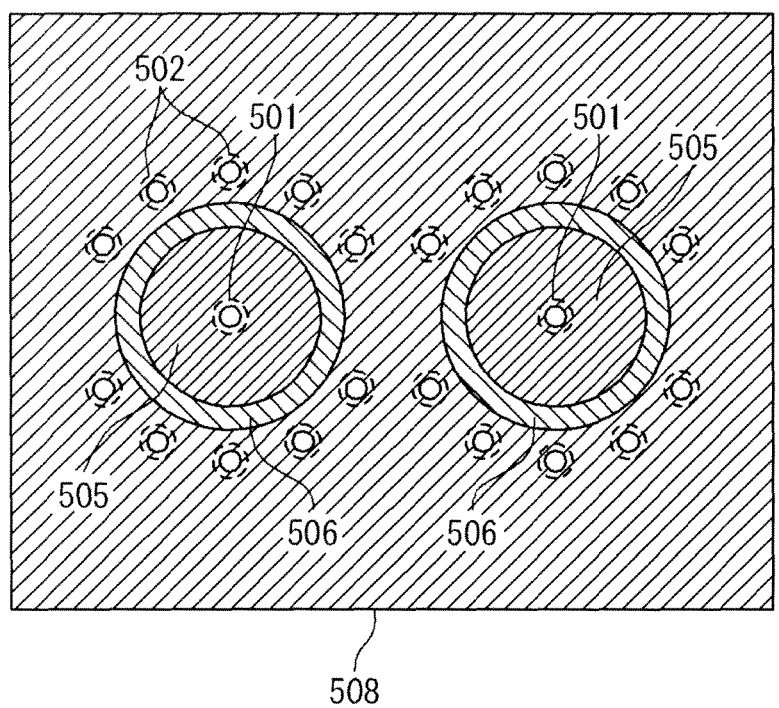
FIG. 5C is a horizontal cross-sectional view of the filter shown in FIG. 5A on the 5C section.
Figure 5D:
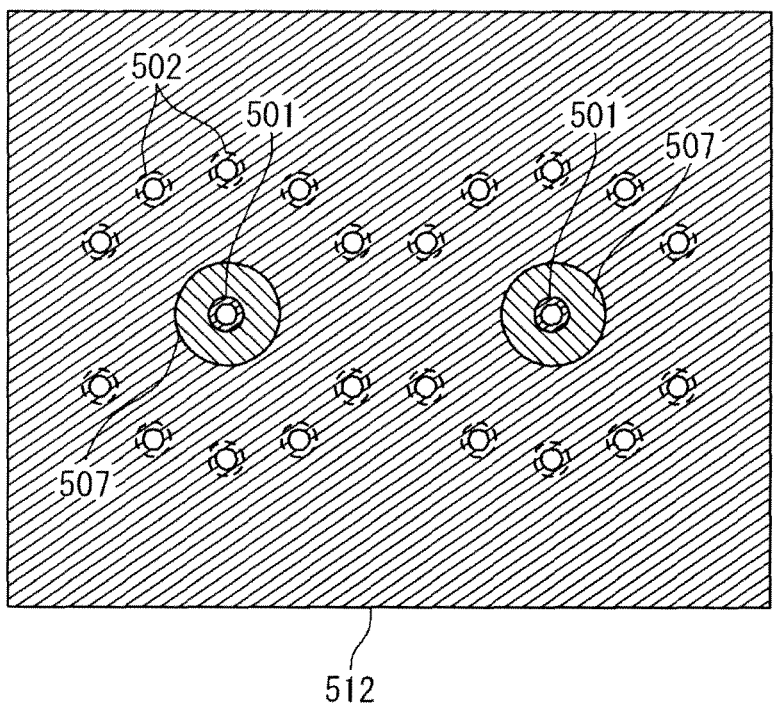
FIG. 5D is a horizontal cross-sectional view of the filter shown in FIG. 5A on the 5D section.
Figure 5E:
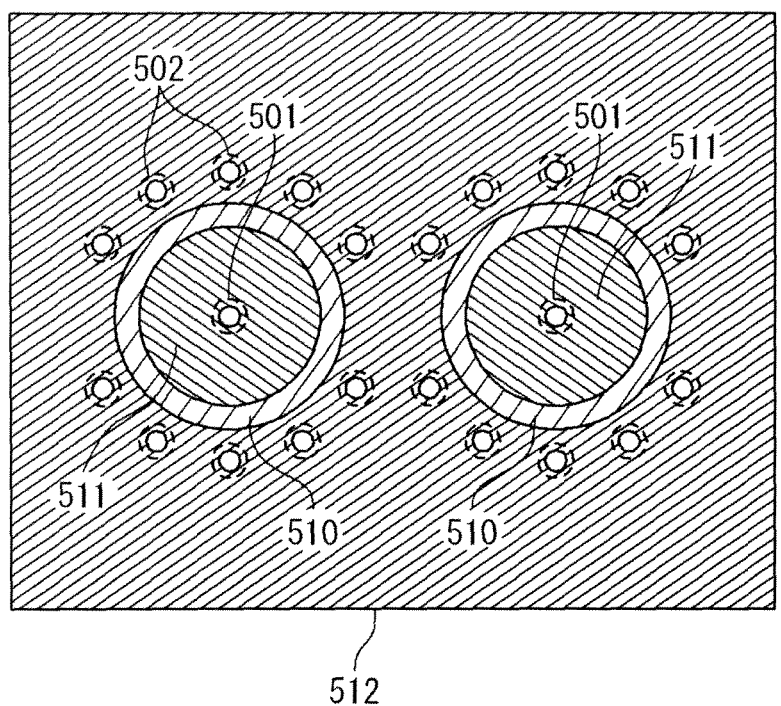
FIG. 5E is a horizontal cross-sectional view of the filter shown in FIG. 5A on the 5E section.
Figure 5F:
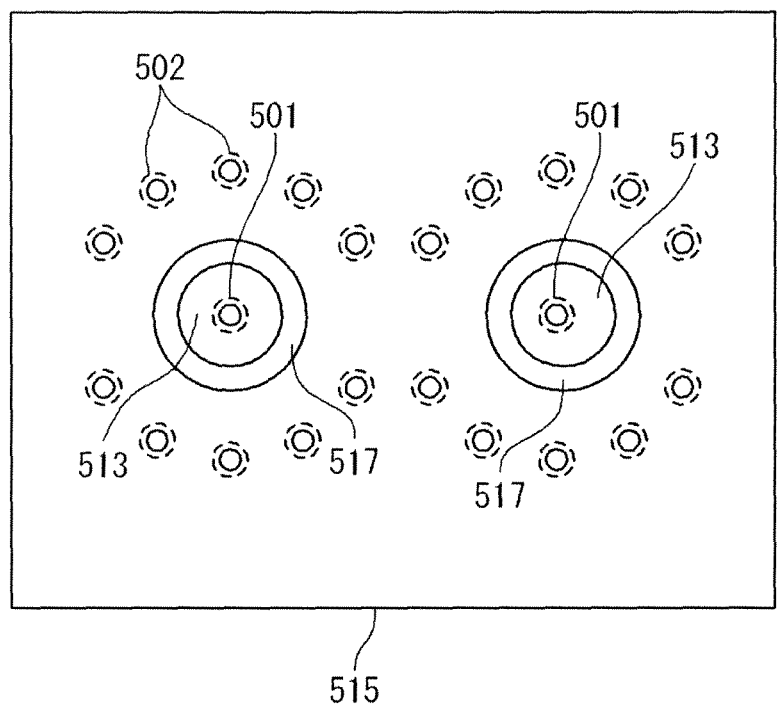
FIG. 5F is a bottom view of the filter shown in FIG. 5A.
Figure 6B:
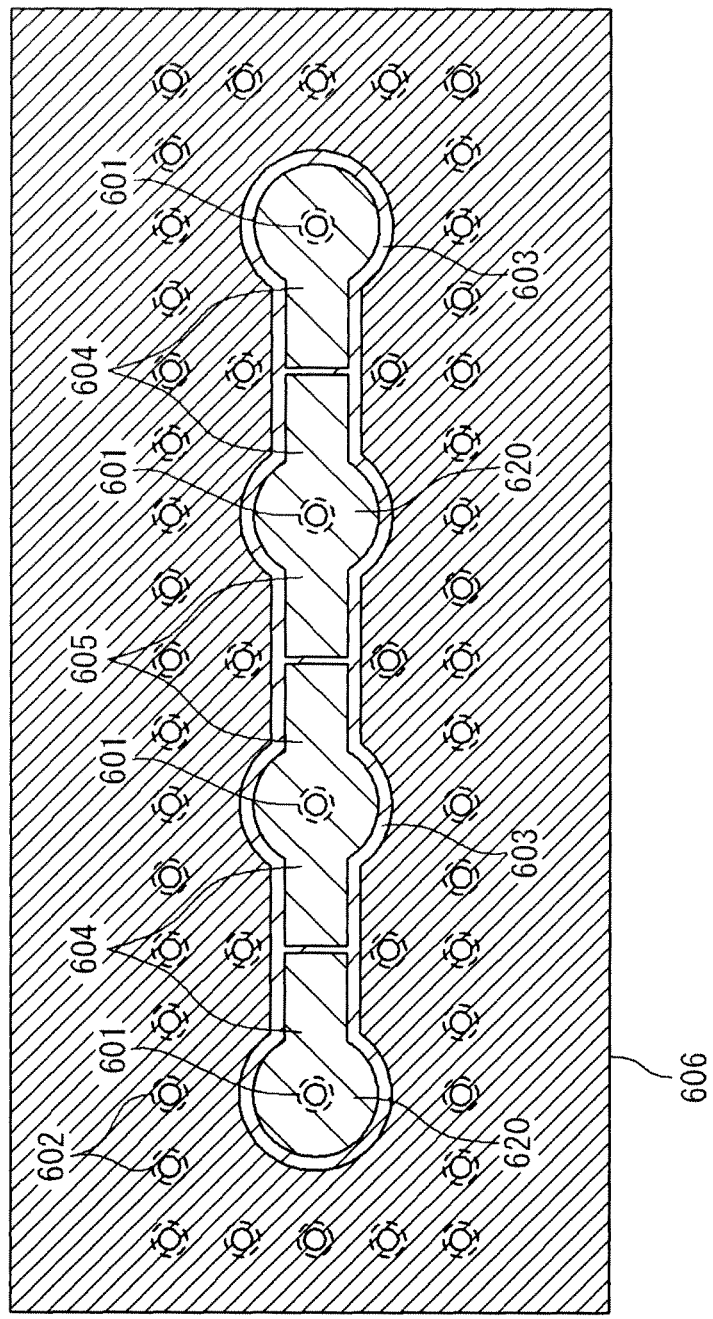
FIG. 6B is a horizontal cross-sectional view of the filter shown in FIG. 6A on the 6B section.
Figure 6D:
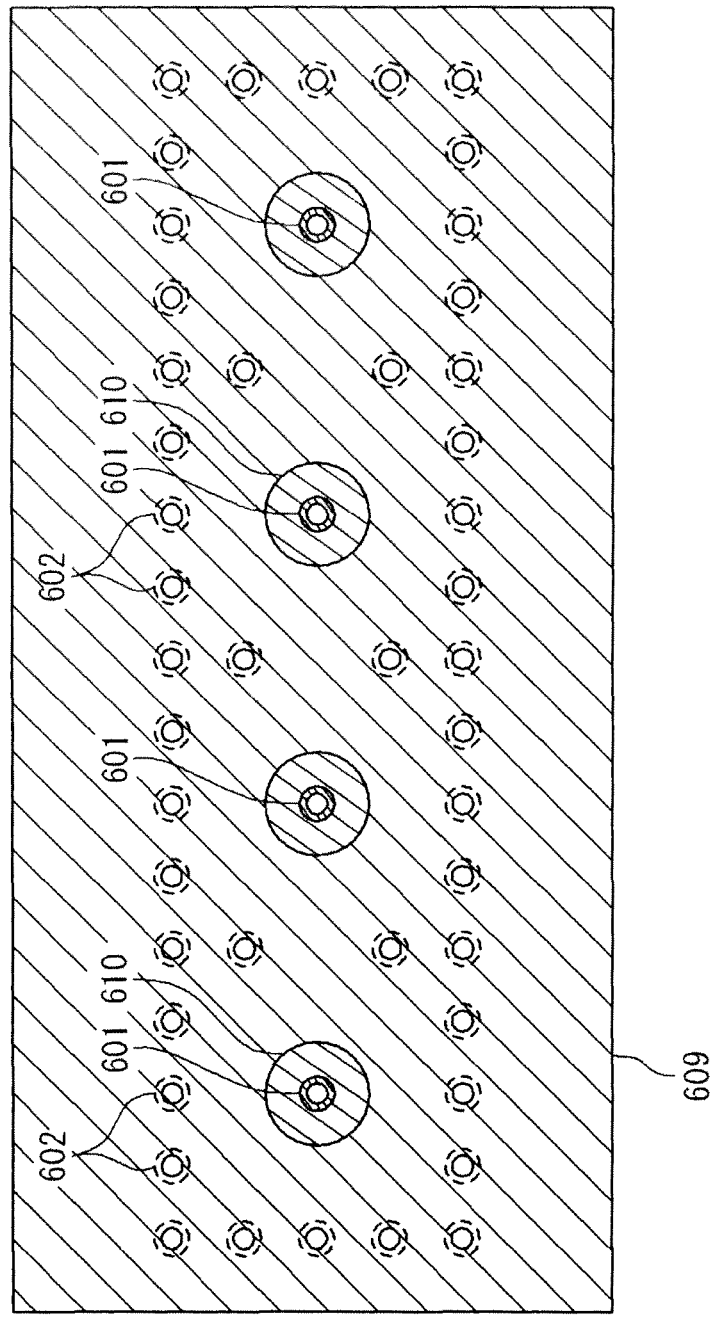
FIG. 6D is a horizontal cross-sectional view of the filter shown in FIG. 6A on the 6D section.
Figure 6E:
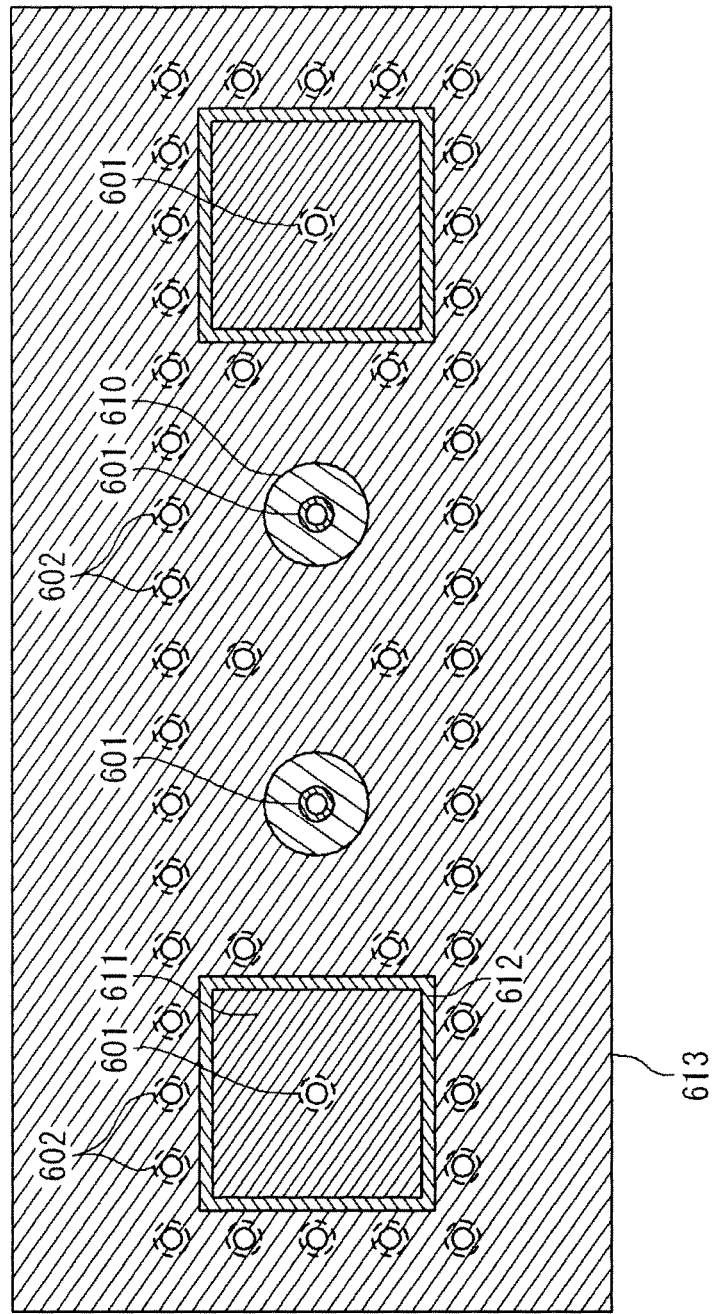
FIG. 6E is a horizontal cross-sectional view of the filter shown in FIG. 6A on the 6E section.
Figure 7A:
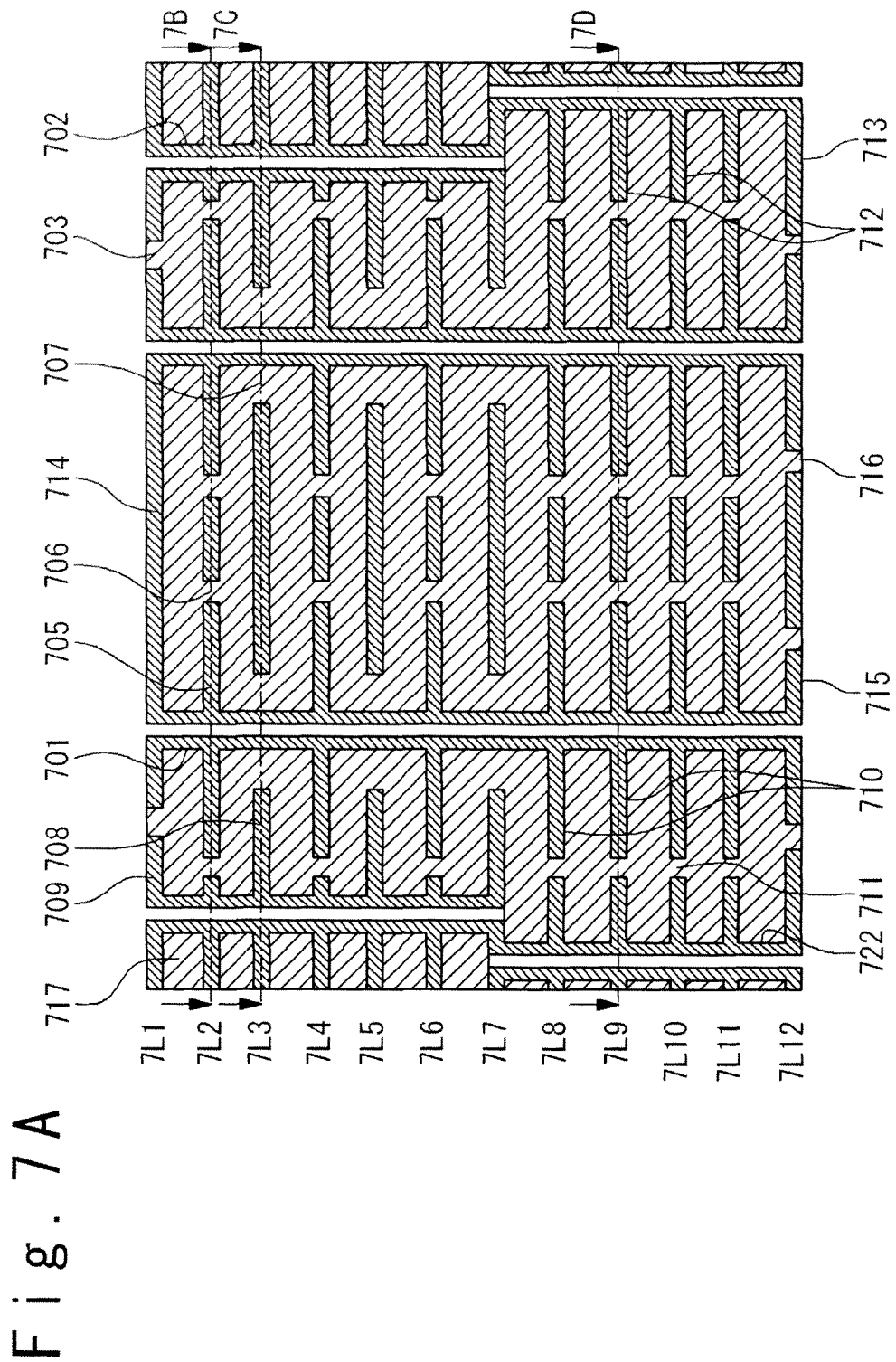
FIG. 7A is a vertical cross-sectional view illustrating a filter formed by two resonant via structures in an exemplary embodiment of the present invention.
Figure 7B:
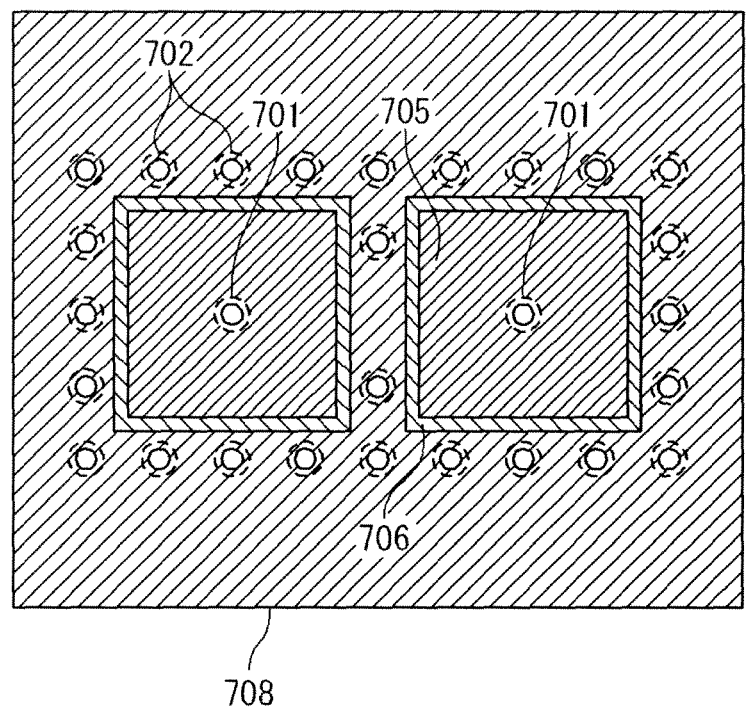
FIG. 7B is a horizontal cross-sectional view of the filter shown in FIG. 7A on the 7B section.
Figure 7C:
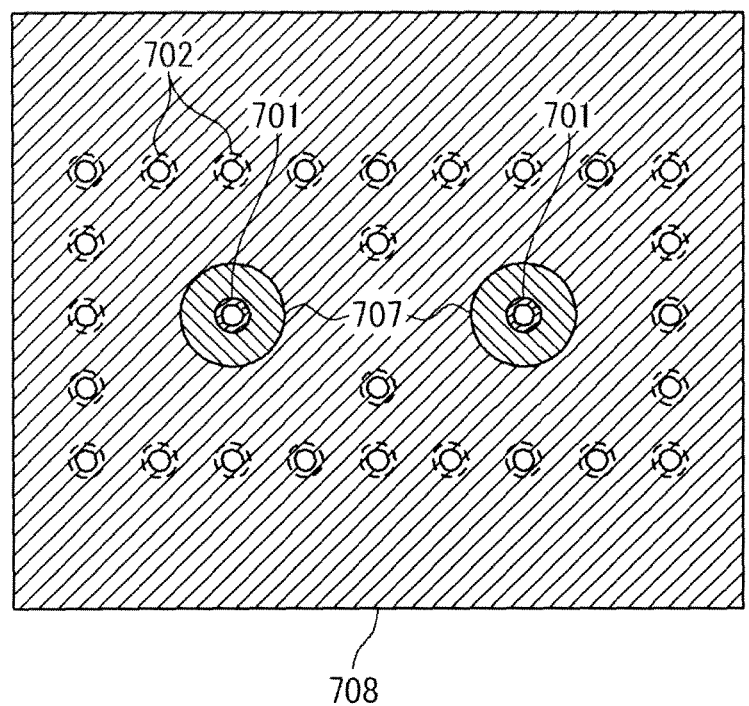
FIG. 7C is a horizontal cross-sectional view of the filter shown in FIG. 7A on the 7C section.
Figure 7D:
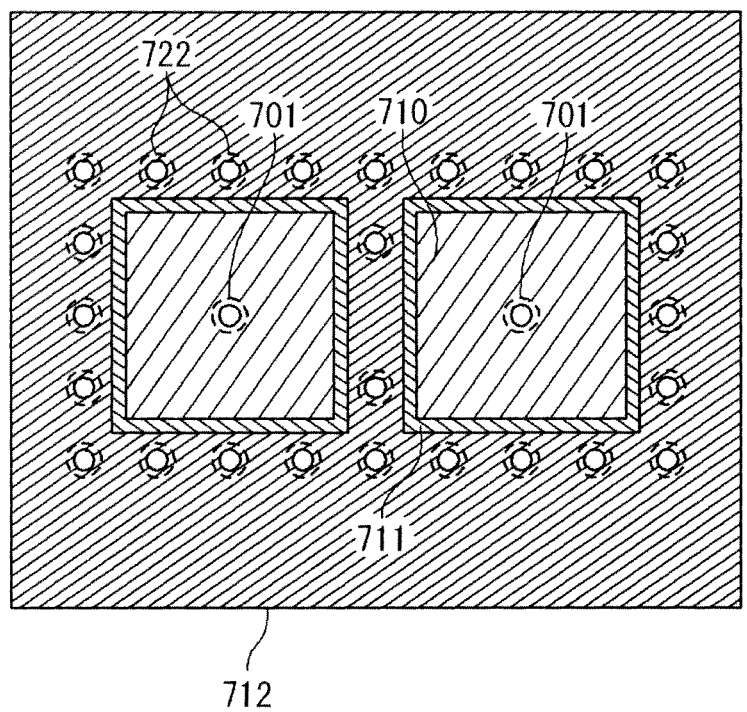
FIG. 7D is a horizontal cross-sectional view of the filter shown in FIG. 7A on the 7D section.
Figure 7E:
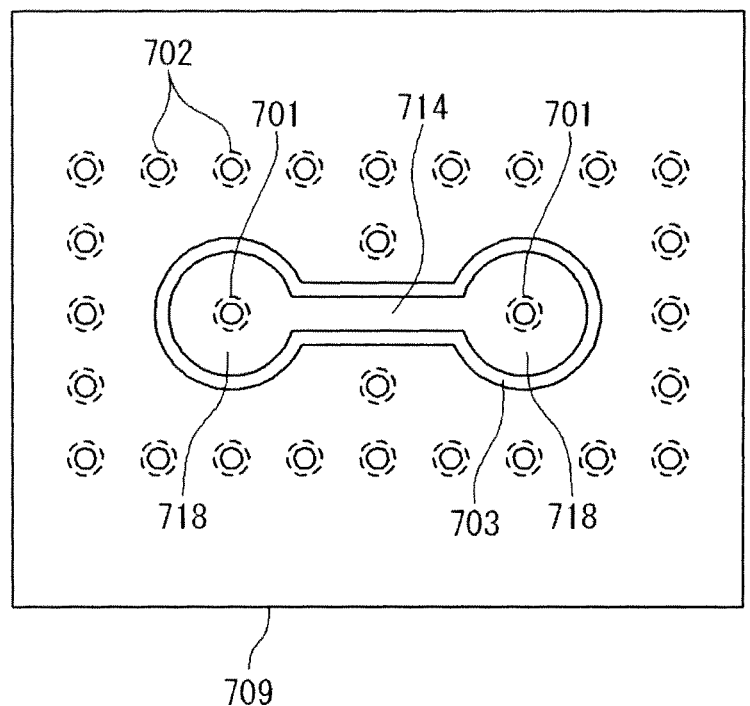
FIG. 7E is top view of the filter shown in FIG. 7A.
Figure 7F:
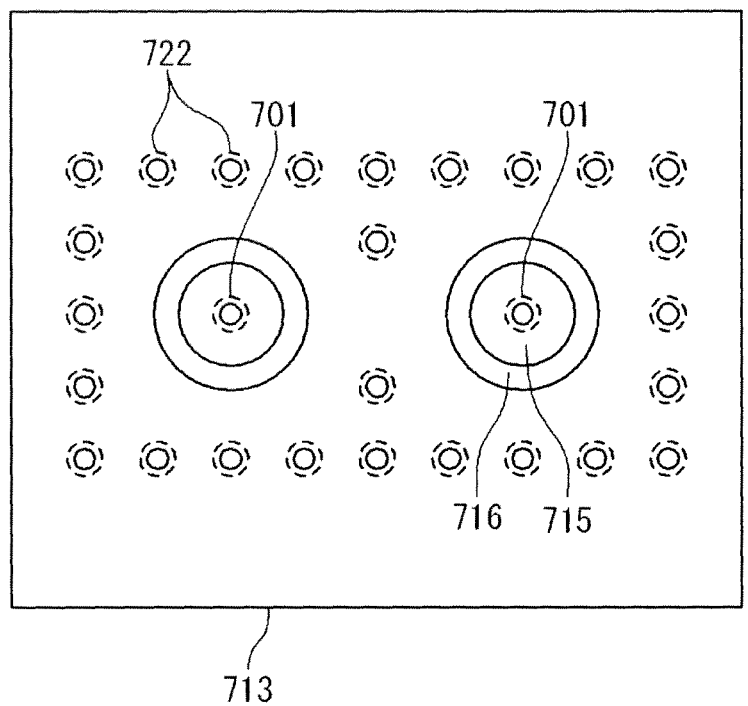
FIG. 7F is bottom view of the filter shown in FIG. 7A.

In FIG. 1H, a physical model explaining these mechanisms is presented. As one can see, two artificial mediums are formed between top and bottom pads of the signal via.

Approximately, the relative effective permittivity of the first artificial medium, $\in_{eff,1}$, can be defined as following:

$$\in_{eff,1} \approx \in \cdot ((a-r)^2/4 \cdot w_1 \cdot d + (a-r)/2 \cdot w_1 + (a-r)/2 \cdot d + 1) \quad (1)$$

where $\in$ is the relative permittivity of the isolating dielectric filling in the substrate a is the side length of a signal conductive plate 105, r is the external diameter of the signal via 101, $w_1$ is the width of an isolating slit 106 and d is the diameter of a clearance hole 107.

For the second artificial medium, the relative effective permittivity, $\in_{eff,2}$, can be approximately written in the form:

$$\in_{eff,2} \approx \in \cdot ((b-r)/2 \cdot w_2 + 1) \quad (2)$$

where b is the side length of a signal conductive plate 112 and $w_2$ is the width of an isolating slit 113.

As follows from Eqs. 1 and 2 controlling dimensions of the conductive plates, the width of isolating slits and dimensions of the clearance holes, required lengths l1 (the length between conductor layers 1L1 and 1L8) and l2 (the length between conductor layers 1L8 and 1L12, including the conductor layer 1L8) for the resonant element can be obtained.

In FIGS. 2A to 2F, another exemplary embodiment of a resonant via structure in a twelve-conductor-layer substrate is shown. In present embodiment, the resonant via structure comprises a plurality of conductor layers 2L1, 2L2, 2L3, 2L4, 2L5, 2L6, 2L7, 2L8, 2L9, 2L10, 2L11, and 2L12, a dielectric 216, a signal via 201, a plurality of ground vias 202, a top pad 204, a ground conductor 209, a clearance hole 203, a bottom ground plane 213, a plurality of signal conductive plates 205 and 210, a plurality of ground conductors 212, a plurality of isolating slits 206 and 211 and a plurality of clearance holes 207.

In this via structure, a signal via 201 is surrounded by ground vias 202 in a round contour. Top pad 204 is isolated from the ground conductor 209 by a clearance hole 203, while bottom pad of the signal via 201 is connected to bottom ground plate 213.

The first artificial medium of presented resonant via structure is disposed in the vertical direction between conductor layers 1L1 and 1L10 and is formed by signal conductive plates 205 connected to the signal via 201 and ground plates 208 connected to the ground vias. Signal conductive plates 205 are isolated from ground conductors by isolating slits 206, while ground plates 208 are separated from the signal via by clearance holes 207.

The second artificial medium is formed between conductor layers 2L10 and 2L12 (including conductor layer 2L10) and is constructed by means of signal conductive plates 210 connected to the signal via 201 and isolated from ground conductors 212 by isolating slits 211.

Here an exemplary embodiment of a filter which comprises two invented resonant via structures is shown in FIGS. 3A to 3F. The filter comprises a twelve-conductor-layer substrate including conductor layers 3L1, 3L2, 3L3, 3L4, 3L5, 3L6, 3L7, 3L8, 3L9, 3L10, 3L11, and 3L12 which are isolated by a dielectric 316, a couple of signal vias 301, a plurality of ground vias 302, a couple of top signal via pads 317, a ground conductor 309, a clearance hole 303, a ground plate 313, a plurality of signal conductive plates 305 and 310, a plurality of ground plates 308, a plurality of isolating slits 306 and 311, a couple of clearance holes 307, a capacitive section 304 and a plurality of ground plates 312.

In this filter, the resonant via structure is obtained by a signal via 301 surrounded by ground vias 302. Top signal via pad 317 of the resonant via structure is isolated from the ground conductor 309 by a clearance hole 303. Also, this pad serves as an input or an output terminal of the filter. The bottom pad of the signal via 301 is connected to the ground plate 313.

The first artificial medium in the resonant via structure is disposed in the vertical direction between conductor layers 3L1 and 3L8 and is formed by signal conductive plates 305 connected to the signal via 301 and ground plates 308 connected to the ground vias 302. Signal conductive plates 305 are isolated from ground conductors by isolating slits 306, and ground plates 308 are separated from the signal via 301 by clearance holes 307.

The second artificial medium is formed between conductor layers 3L8 and 3L12 (including conductor layer 3L8) and is constructed by means of signal conductive plates 310 connected to the signal via 301 and isolated from ground conductors 312 by isolating slits 311.

In the filter, two resonant via structures are coupled by means of capacitive section 304. The section is formed as coplanar transmission line segments connected to the signal via pad 317 and are isolated from each other by an isolating slit. The width of this slit and also dimensions of the transmission line provide a required coupling capacitance between resonant via structures.

Another exemplary embodiment of a filter which comprises two invented resonant via structures is shown in FIGS. 4A to 4J. This filter is formed in two types of multilayer substrates connected with each other by means of a ball grid array. Note types of multilayer substrates can be both different and same ones and can include printed circuit board (PCB), interposer, packaging and so on.

The first type of multilayer substrates includes a plurality of conductor layers 4L1, 4L2, 4L3, 4L4, 4L5, 4L6, 4L7, 4L8, 4L9, 4L10 and 4L11 which are isolated by a dielectric 430, a couple of signal vias 401, a plurality of ground vias 402, a couple of top signal via pads 403, a ground conductor 404, a couple of clearance holes 405, a plurality of ground plates 406, a plurality of signal conductive plates 407, a plurality of isolating slits 408, a couple of signal via pads 422, a couple of isolating slits 423 and a ground conductor 424.

The second type of multilayer substrates comprises a plurality of conductor layers 4L13, 4L14, 4L15, 4L16, 4L17, 4L18, 4L19 and 4L20 which are isolated by a dielectric 431, a couple of signal vias 411, a plurality of ground vias 412, a ground conductor 413, a ground plate 414, a couple of clearance holes 415, a plurality of signal conductive plates 426, a plurality of isolating slits 416, a plurality of ground plates 417, a ground conductor 418, a couple of isolating slits 419 and a couple of signal via pads 420.

Both multilayer substrates are connected with each other by means of a ball grid array 410 disposed in layer 4L12.

In this filter, a signal via conductor of the resonant via structure is formed by the signal via 401, a signal ball of the ball grid array 410 and the signal via 411. This signal conductor is surrounded by ground conductors comprising ground vias 402, ground balls 421 and ground vias 412.

The top signal via pad 403 is isolated from ground conductor 404 by an isolating slit. This via pad 403 provides a required capacitive coupling between resonant via structures. Also the signal via pad 403 serves as a terminal of the filter and is connected to a device 425 (as for an example, an integrated circuit) by means of solder ball 409.

The bottom signal via pad is connected to a ground conductor 413.

The first artificial medium in the resonant via structure is disposed in the vertical direction between conductor layer 4L1 of the first substrate and conductor layer 4L15 of the second substrate. This artificial medium is formed by signal conductive plates 407 and a signal via pad 422 connected to the signal via 401 and a signal via pad 420 connected to the signal via 411, as well as ground plates 406 and ground plate 414, wherein ground plates 406 are connected to the ground vias 402, while ground pad 418 and ground plate 414 are connected to ground vias 412. Signal conductive plates 407 are isolated from ground conductors by isolating slits 408, the signal via pad 422 is isolated from ground conductor 424 by an isolating slit 423, and the signal via pad 420 is isolated from a ground conductor 418 by an isolating slit 419. Ground plates 406 are separated from the signal via 401 by clearance holes 405, and ground plate 414 is isolated from the signal via 411 by a clearance hole 415. Note that a construction as ground-signal-ground-signal- . . . -in a plate arrangement is used in presented example.

The second artificial medium is formed between conductor layers 4L15 and 4L20 (including conductor layer 4L15) and is constructed by means of signal conductive plates 426 connected to the signal via 411 and isolated from ground conductors by isolating slits 416.

Another exemplary embodiment of a filter which comprises two invented resonant via structures is shown in FIGS. 5A to 5F. This filter comprises a twelve-conductor-layer substrate including conductor layers 5L1, 5L2, 5L3, 5L4, 5L5, 5L6, 5L7, 5L8, 5L9, 5L10, 5L11, and 5L12 which are isolated by a dielectric 516, a couple of signal vias 501, a plurality of ground vias 502, a couple of clearance holes 503, a coupling section 504, a plurality of signal conductive plates 505, a plurality of isolating slits 506, a plurality of clearance holes 507, a plurality of ground plates 508, a ground conductor 509, a plurality of signal conductive plates 510, a plurality of isolating slits 511, a plurality of ground plates 512, a couple of bottom via pads 513, a couple of coplanar microstrip line 514, a ground plane 515, a couple of clearance holes 517 and a couple of signal via pads 520.

In this filter, the resonant via structure is obtained by signal via 501 surrounded by ground vias 502. Top signal via pad 520 of the resonant via structure is isolated from ground conductor 509 by a clearance hole 503. This signal via pad 520 is connected to coupling section 504 formed by two isolating strips. Also the signal via pad 520 is connected to a coplanar microstrip line 514 which serves as an input or an output terminal of the filter to integrate this filter with other devices. Bottom signal via pad 513 is isolated from a ground plate 515 by a clearance hole 517.

The first artificial medium is formed between conductor layers 5L1 and 5L6 (including conductor layer 5L6) and is constructed by means of signal conductive plates 505 connected to the signal via 501 and isolated from ground conductors 508 by isolating slits 506.

The second artificial medium in the resonant via structure is disposed in the vertical direction between conductor layers 5L6 and 5L12 and is formed by signal conductive plates 510 connected to the signal via 501 and ground plates 512 connected to the ground vias 502. Signal conductive plates 510 are isolated from ground conductors by isolating slits 511, and ground plates 512 are separated from the signal via 501 by clearance holes 507.

Note, in contrary to aforementioned examples, in this filter, the first artificial medium has a lower relative effective permittivity compared with the second artificial medium.

In FIGS. 6A to 6F, another exemplary embodiment of a filter is presented. This filter comprises four resonant vias structures in which two resonant via structures have two different artificial mediums, while two other resonant via structures have one artificial medium. The filter comprises a ten-conductor-layer substrate including conductor layers 6L1, 6L2, 6L3, 6L4, 6L5, 6L6, 6L7, 6L8, 6L9 and 6L10 which are isolated by a dielectric 616, four signal vias 601, a plurality of ground vias 602, four clearance holes 603, a couple of coupling sections 604, a coupling section 605, a ground conductor 606, a plurality of signal conductive plates 607, a plurality of isolating slits 608, a plurality of ground plates 609, a plurality of clearance holes 610, a plurality of signal conductive plates 611, a plurality of isolating slits 612, a plurality of ground conductors 613, a ground plate 614 and four signal via pads 620.

In this filter, the resonant via structures are obtained by signal vias 601 surrounded by ground vias 602. Top signal via pads 620 of the resonant via structures are isolated from ground conductor 606 by clearance holes 603. Left and right top signal via pads 620 serve as terminals of the filter. Coupling sections 604 and 605 formed by isolating strip segments are connected to top signal via pads 620. Also, to control capacitances of the coupling sections 604, an additional coupling element is connected to the strips of the coupling sections 604. This additional coupling element can be a turning lumped capacitor, a chip capacitor or so on.

The bottom signal via pad of the resonant via structures is connected to the ground plate 614.

Both left and right resonant via structures of the filter have two artificial mediums which are formed as following.

The first artificial medium in the left or right resonant via structure is disposed in the vertical direction between conductor layers 6L1 and 6L8 and is formed by signal conductive plates 607 connected to the signal via 601 and ground plates 609 connected to the ground vias 602. Signal conductive plates 607 are isolated from ground conductors by isolating slits 608, and ground plates 609 are separated from the signal via 601 by clearance holes 610.

The second artificial medium in the left or right resonant via structure is formed between conductor layers 6L8 and 6L10 (including conductor layer 6L8) and is designed by means of signal conductive plates 611 connected to the signal via 601 and isolated from ground conductors 613 by isolating slits 612.

Two other resonant via structures situated between left and right resonant via structures have an artificial medium which is constructed in a following manner.

The artificial medium is situated in the vertical direction between conductor layers 6L1 and 6L10 and is formed by signal conductive plates 607 connected to the signal via 601 and ground plates 609 connected to the ground vias 602. Signal conductive plates 607 are isolated from ground conductors by isolating slits 608, and ground plates 609 are separated from the signal via 601 by clearance holes 610.

It should be noted that in a similar manner as in FIGS. 6A-6F, a periodic structure in which a unit cell is a resonant via structure can be formed in a multilayer substrate.

Another exemplary embodiment of a filter is presented in FIGS. 7A to 7F. This filter comprises two resonant via structures in a twelve-conductor-layer substrate including conductor layers 7L1, 7L2, 7L3, 7L4, 7L5, 7L6, 7L7, 7L8, 7L9, 7L10, 7L11, and 7L12 which are isolated by a dielectric 717, a couple of signal vias 701, a plurality of ground vias 702, a couple of clearance holes 703, a plurality of signal conductive plates 705, a plurality of isolating slits 706, a plurality of clearance holes 707, a plurality of ground plates 708, a ground conductor 709, a plurality of signal conductive plates 710, a plurality of isolating slits 711, a plurality of ground conductors 712, a ground conductor 713, a strip segment 714, a couple of bottom via pads 715, a couple of clearance holes 716, a couple of top signal via pads 718 and a plurality of ground vias 722.

In this filter, the resonant via structure is obtained by a signal via 701 surrounded by ground vias 702 in conductor layers including 7L1 to 7L7 and ground vias 722 in conductor layers including 7L7 to 7L12. Note the distance separating the ground vias 702 from the signal via 701 and ground vias 722 from the signal via 701 is different as it can be seen in FIG. 7A.

Top signal via pad 718 of the resonant via structure is isolated from ground conductor 709 by a clearance hole 703. This signal via pad serves as an input or an output terminal of the filter. Also, the top signal via pad 718 provides an inductive coupling between two resonant via structures by means of a strip segment 714 connected to both top signal via pads

718. Note that the inductive coupling between resonant via structures can be provided by means of a device like a chip inductor.

Bottom pad 715 of the signal via 701 in the resonant via structures is isolated from the ground conductor 713 by a clearance hole 716.

The first artificial medium in the resonant via structure is disposed in the vertical direction between conductor layers 7L1 and 7L8 and is formed by signal conductive plates 705 connected to the signal via 701 and ground plates 708 connected to the ground vias 702. Signal conductive plates 705 are isolated from ground conductors by isolating slits 706, and ground plates 708 are separated from the signal via 701 by clearance holes 707.

The second artificial medium is formed between conductor layers 7L8 and 7L12 (including conductor layer 7L8) and is constructed by means of signal conductive plates 710 connected to the signal via 701 and isolated from ground conductors 712 by isolating slits 711.

To show the electrical performance of a filter based on an invented resonant via structure full-wave simulations for a typical configuration were carried out by the Finite-Difference Time-Domain (FDTD) technique.

Considered configuration is similar to the filter structure shown in FIGS. 3A-3F. In an example presented here, twelve copper conductive layers were isolated by a dielectric (similar to FR4 (Flame Retardant type 4) material) having the relative permittivity 4.17 and loss tangent 0.023 as it was assumed in simulations. The top signal via pads of the resonant via structures were input and output ports of the filter.

Dimensions of the filter structure were as following: the thickness of the twelve-conductor-layer substrate was 2.6 mm; the thickness of copper conductor layers was 0.035 mm; the diameter of the signal via conductor was 0.7 mm; the pad diameter was 0.95 mm; ground vias in the structures were arranged as the square with the side of 2.7 mm; conductive plates connected to the signal via had the square form with the side of 2.1 mm; the isolating slits separating these plates from the ground conductors had the width of 0.1 mm; the diameter of the clearance hole separating the ground plates from the signal via was 0.9 mm.

Figure 8:
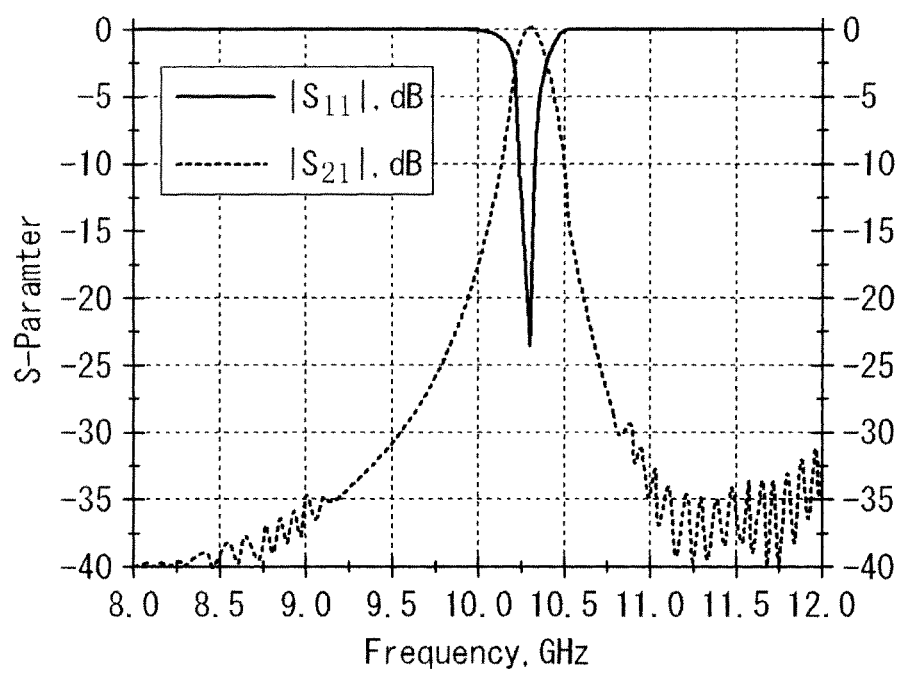
FIG. 8 is a graph showing the electrical performance of the filter forming by two resonant via structures.

In FIG. 8, simulated data for the filter are presented by means of magnitudes of S-Parameters where $|S_{21}|$ is for insertion loss and $|S_{11}|$ is for return losses.

As follows from simulation results, filters based on invented resonant via structures can provide high-performance narrow pass band characteristics.

It should be well understandable that other types of filters like stop-band and pass-band ones can be obtained by the use of invented resonant via structures.

While the present invention has been described in relation to some exemplary embodiments, it is to be understood that these exemplary embodiments are for the purpose of description by example, and not of limitation. While it will be obvious to those skilled in the art upon reading the present specification that various changes and substitutions may be easily made by equal components and art, it is obvious that such changes and substitutions lie within the true scope and spirit of the presented invention as defined by the claims.

The invention claimed is:

1. A resonant via structure, comprising:
    a multilayer substrate, including a plurality of conductor layers and a dielectric isolating each of said plurality of conductor layers;
    a signal via conductor, disposed through said multilayer substrate; and
    a plurality of ground vias, disposed through said multilayer substrate and around said signal via conductor,
    wherein said plurality of conductor layers comprise:
        a first plurality of signal conductive plates connected to said signal via conductor;
        a second plurality of signal conductive plates connected to said signal via conductor;
        a first plurality of ground conductive plates connected to said plurality of ground vias and disposed on a same one of said plurality of conductor layers as said first plurality of signal conductive plates;
        a second plurality of ground conductive plates connected to said plurality of ground vias and disposed on a same one of said plurality of conductor layers as said second plurality of signal conductive plates;
        a third plurality of ground conductive plates connected to said plurality of ground vias and, in said third plurality of ground conductive plates, each ground conductive plate being disposed on one of said plurality of conductor layers above or below with respect to one of said first plurality of signal conductive plates;
        a plurality of clearance areas separating said third plurality of ground conductive plates from said signal via conductor;
        a first plurality of isolating slits separating said first plurality of signal conductive plates from said plurality of ground vias and said first plurality of ground conductive plates; and
        a second plurality of isolating slits separating said second plurality of signal conductive plates from said plurality of ground vias and said second plurality of ground conductive plates,
    wherein each of said first plurality of signal conductive plates is arranged under or above of one of said third plurality of ground conductive plates, and
    wherein said multilayer substrate comprises:
        a first artificial medium section, disposed between said signal via and said plurality of ground vias in a plane of said plurality of conductor layers and between a first and another layers of said plurality of conductor layers in a direction of said signal via, having a first relative effective permittivity, wherein said first artificial medium section is formed by said first plurality of signal plates, said first plurality of isolating slits, said third plurality of ground plates, and said plurality of clearance holes; and
        a second artificial medium section, disposed between said signal via and said plurality of ground vias in the plane of said plurality of conductor layers and between said another and last layers of said plurality of conductor layers in the direction of said signal via, having a second relative effective permittivity which is different from said first relative effective permittivity, and
    wherein said second artificial medium section is formed by said second plurality of signal plates and said second plurality of isolating slits.

2. The resonant via structure according to claim 1, wherein said first plurality of signal conductive plates comprise:
    a first pad connected to one end of said signal via conductor,
    wherein said plurality of clearance areas comprise:
        a first clearance area isolating said first pad from a conductor disposed on a same conductor layer as said first pad, and wherein another end of said signal via conductor is connected to one of said plurality of ground conductive plates disposed at a same conductor layer as said another end of said signal via conductor.

3. The resonant via structure according to claim 2, wherein said first relative effective permittivity is higher than said second relative effective permittivity.

4. A filter comprising a first and a second resonant via structures,
wherein each of said first and second resonant via structures comprises a resonant via structure according to claim 3, and
wherein a first signal via conductor of said first resonant via structure and a second signal via conductor of said second resonant via structure comprise a capacitive-coupled structure.

5. The resonant via structure according to claim 2, wherein said first relative effective is lower than said second relative effective permittivity.

6. A filter comprising a first and a second resonant via structures, wherein each of said first and second resonant via structures comprises a resonant via structure according to claim 2, and
wherein a first signal via conductor of said first resonant via structure and a second signal via conductor of said second resonant via structure comprise a capacitive-coupled structure.

7. The filter according to claim 6, wherein said capacitive-coupled structure comprises:
a first planar transmission line segment connected to said first pad of said first resonant via structure; and
a second planar transmission line segment connected to said first pad of said second resonant via structure, and
wherein said first and second planar transmission line segments are isolated by said first clearance area of said first and second resonant via structure.

8. The filter according to claim 6, wherein said capacitive-coupled structure comprises a capacitor connected between said first pad of said first resonant via structure and said first pad of said second resonant via structure.

9. The filter according to claim 6, wherein said first pad serves as a terminal of said filter.

10. The filter according to claim 9, wherein said first pad is connected to a planar transmission line of a circuit system.

11. The filter according to claim 10, wherein said first pad is connected to a ball grid array of the circuit system.

12. A filter comprising first and second resonant via structures, wherein each of said first and second resonant via structures comprises a resonant via structure according to claim 2, and
wherein a first signal via conductor of said first resonant via structure and a second signal via conductor of said second resonant via structure comprise a inductive-coupled structure.

13. The filter according to claim 12, wherein said inductive-coupled structure comprises a planar transmission line segment connected between said first pad of said first resonant via structure and said first pad of said second resonant via structure.

14. The filter according to claim 12, wherein said inductive-coupled structure comprises a inductor connected between said first pad of said first resonant via structure and said first pad of said second resonant via structure.

15. A filter comprising a plurality of resonant via structures periodically arranged, wherein each of said plurality of resonant via structures comprises a resonant via structure according to claim 2.

16. A filter comprising a first and a second resonant via structures, wherein each of said first and second resonant via structures comprises a resonant via structure according to claim 2, and
wherein said first and said second relative effective permittivities of said first resonant via structure are different.

17. The resonant via structure according to claim 1, wherein said first plurality of signal conductive plates comprise:
a first pad connected to one end of said signal via conductor; and
a second pad connected to another end of said signal via conductor, and
wherein said plurality of clearance areas comprise:
a first clearance area isolating said first pad from a conductor disposed at a same one of said plurality of conductor layers as said first pad; and
a second clearance area isolating said second pad from a conductor disposed at a same one of said plurality of conductor layers as said second pad.

18. The resonant via structure according to claim 17, wherein said first relative effective permittivity is higher than said second relative effective permittivity.

19. The resonant via structure according to claim 17, wherein said first relative effective permittivity is lower than said second relative effective permittivity.

20. A filter comprising a first and a second resonant via structures, wherein each of said first and second resonant via structures comprises a resonant via structure according to claim 17, and
wherein a first signal via conductor of said first resonant via structure and a second signal via conductor of said second resonant via structure comprise a capacitive-coupled structure.

* * * * *